United States Patent [19]
Mori et al.

[11] Patent Number: 5,578,968
[45] Date of Patent: Nov. 26, 1996

[54] FREQUENCY CONVERTER, MULTISTAGE FREQUENCY CONVERTER AND FREQUENCY SYNTHESIZER UTILIZING THEM

[75] Inventors: Shinsaku Mori, c/o Keio Gijuku Daigaku, Rikougakubu, Denkikougakuka 14-1, Hiyoshi 3-Chome, Kouhoku-ku, Yokohama-shi, Kanagawa 223; Duk-Kyu Park, c/o Keio Gijuku Daigaku, Rikougakubu, Denkikougakuka Mori-Kenkyushitsu 14-1, Hiyoshi 3-Chome, Kouhoku-ku, Yokohama-shi, Kanagawa 223; Hiroshi Miyagi, Yokohama, all of Japan

[73] Assignees: Shinsaku Mori; Shintom Co., Ltd.; Duk-Kyu Park, all of Kanagawa, Japan

[21] Appl. No.: 482,797

[22] Filed: Jun. 7, 1995

Related U.S. Application Data

[63] Continuation of Ser. No. 75,513, filed as PCT/JP92/01349 Oct. 16, 1992 published as WO93/08645 Apr. 29, 1993, abandoned.

[30] Foreign Application Priority Data

Oct. 17, 1991 [JP] Japan .................................. 3-269784
Sep. 7, 1992 [JP] Japan .................................. 4-237532
Oct. 2, 1992 [JP] Japan .................................. 4-265178

[51] Int. Cl.⁶ .......................... H03K 23/66; H03K 23/68; H03L 7/197
[52] U.S. Cl. ................ 331/1 A; 331/25; 377/48
[58] Field of Search .................. 331/1 A, 25; 377/48

[56] References Cited

U.S. PATENT DOCUMENTS

| | | | |
|---|---|---|---|
| 3,605,025 | 9/1971 | Lincoln et al. | 328/48 |
| 3,808,347 | 4/1974 | Gehrig | 84/1.01 |
| 3,872,397 | 3/1975 | Hanneman | 331/1 A |
| 3,928,813 | 12/1975 | Kingsford-Smith | 331/1 A |
| 4,573,176 | 2/1986 | Yeager | 377/48 |

FOREIGN PATENT DOCUMENTS

| | | |
|---|---|---|
| 0340870A2 | 11/1989 | European Pat. Off. . |
| 0440405A1 | 8/1991 | European Pat. Off. . |
| 49-3555 | 1/1974 | Japan . |
| 50-115460 | 9/1975 | Japan . |
| 51-416 | 1/1976 | Japan . |
| 55-664 | 1/1980 | Japan . |
| 55-121539 | 8/1980 | Japan . |

(List continued on next page.)

OTHER PUBLICATIONS

Duk-Kyu Park and Shinsaku Mori, "Fast Acquisition Frequency Synthesizer with N–Stage Novel Type Cycle Swallowers," IEEE Communications Society, Conference Proceedings of IEEE International Conference on Communicaitons, Jun. 14–18, 1992, Chicago, IL., pp. 319.6.1–319.6.5.

*Primary Examiner*—Siegfried H. Grimm
*Attorney, Agent, or Firm*—Oliff & Berridge

[57] ABSTRACT

A frequency synthesizer includes a phase detector for comparing a reference frequency with a feedback frequency, a filter connected to the phase detector for permitting the passage of low frequency therethrough, a voltage controlled oscillator connected to the filter, a multistage frequency converter for receiving the oscillator signal from the voltage controlled oscillator as an input, and a divider for dividing the output of the multistage frequency converter to form the feedback frequency. The multistage frequency converter includes a plurality of frequency converters connected in series or parallel to each other, each of the frequency converters being adapted to perform a non-integer division. The division ratio can be set arbitrarily and finely. Thus, the feedback frequency inputted to the phase detector can be maintained constant and yet higher, irrespectively of the output frequency of the frequency synthesizer. Therefore, the reference frequency can be also maintained higher as is the feedback frequency, irrespectively of the frequency interval in the output frequency of the voltage controlled oscillator. This enables the acquisition time to be greatly reduced.

22 Claims, 53 Drawing Sheets

FOREIGN PATENT DOCUMENTS

| | | |
|---|---|---|
| 59-35556 | 8/1984 | Japan . |
| 60-500593 | 4/1985 | Japan . |
| 60-172808 | 9/1985 | Japan . |
| 60-172807 | 9/1985 | Japan . |
| 63-290409 | 11/1988 | Japan . |
| 1-120910 | 5/1989 | Japan . |
| 1-238220 | 9/1989 | Japan . |
| 2-44557 | 2/1990 | Japan . |
| 2-101663 | 4/1990 | Japan . |
| 2-224558 | 9/1990 | Japan . |
| 2-271717 | 11/1990 | Japan . |
| 2-305022 | 12/1990 | Japan . |
| 3-131120 | 6/1991 | Japan . |
| 3-206721 | 9/1991 | Japan . | vertical : 0.4mV/div, horizontal : 1 sec/div
4.1001MHz → 4.1408MHz, fr=100Hz, N=41,001 → 41,408 vertical : 0.4mV/div, horizontal : 1 sec/div
4.1001MHz → 4.1408MHz, fr=10KHz, N=400
M1=80, M2=157, M3=173 → M1=40, M2=128, M3=126 vertical : 0.4mV/div, horizontal : 100msec/div
4.1001MHz → 4.1408MHz, fr=100Hz, N=41,001 → 41,408 vertical : 0.4mV/div, horizontal : 100msec/div
4.1001MHz→4.1408MHz, fr=10KHz, N=400
M1=80, M2=157, M3=173→M1=40, M2=128, M3=126 vertical : 0.4mV/div, horizontal : 0.5msec/div
4.1001MHz→ 4.1408MHz, fr=10KHz, N=400
M1=80, M2=157, M3=173→M1=40, M2=128, M3=126 vertical : 0.4mV/div, horizontal : 1 sec/div
4.1001MHz→4.1408Mz, fr=100Hz, N=41.001→ 41.408 vertical : 0.4mV/div, horizontal : 10 msec/div
4.1001MHz → 4.1408MHz, fr=10KHz, N=400
M1=80, M2=157, M3=173 → M1=40, M2=128, M3=126 vertical : 10 dB/div, horizontal : 5KHz/div
band witdh : 300Hz, center frequency : 4,140.8KHz
reference frequency(fr) : 10KHz

FIG. 17A

| NUMBER | FREQUENCY (KHz) | M1 | M2 | M3 | ERROR (Hz) |
|---|---|---|---|---|---|
| 1 | 1425000 | 133 | 106 | 54 | 0 |
| 2 | 1424975 | 72 | 436 | 52 | -2.14267 |
| 3 | 1424950 | 175 | 305 | 38 | -3.88319 |
| 4 | 1424925 | 539 | 486 | 32 | 10.8483 |
| 5 | 1424900 | 538 | 491 | 32 | 5.7619 |
| 6 | 1424875 | 37 | 187 | 349 | -.429146 |
| 7 | 1424850 | 46 | 177 | 126 | 0 |
| 8 | 1424825 | 213 | 287 | 37 | -3.02371 |
| 9 | 1424800 | 269 | 225 | 37 | -2.49867 |
| 10 | 1424775 | 471 | 376 | 33 | 0 |
| 11 | 1424750 | 41 | 276 | 139 | 0 |
| 12 | 1424725 | 130 | 322 | 41 | .603734 |
| 13 | 1424700 | 35 | 467 | 229 | -1.27338 |
| 14 | 1424675 | 63 | 418 | 59 | 1.40044 |
| 15 | 1424650 | 38 | 250 | 209 | -3.33976 |
| 16 | 1424625 | 40 | 525 | 122 | 6.67272 |
| 17 | 1424600 | 51 | 76 | 419 | 0 |
| 18 | 1424575 | 39 | 461 | 138 | -9.6043 |
| 19 | 1424550 | 51 | 83 | 288 | -12.7475 |
| 20 | 1424525 | 83 | 149 | 61 | -1.37332 |
| 21 | 1424500 | 51 | 91 | 222 | 0 |
| 22 | 1424475 | 35 | 291 | 343 | 3.55859 |
| 23 | 1424450 | 547 | 222 | 35 | -1.02373 |
| 24 | 1424425 | 37 | 411 | 183 | -3.35031 |
| 25 | 1424400 | 398 | 342 | 34 | -8.86413 |
| 26 | 1424375 | 265 | 301 | 36 | 0 |
| 27 | 1424350 | 60 | 370 | 64 | 1.85918 |
| 28 | 1424325 | 100 | 368 | 45 | 6.19272 |

FIG. 17B

| | | | | | |
|---|---|---|---|---|---|
| 29 | 1424300 | 49 | 189 | 108 | 2.48558 |
| 30 | 1424275 | 523 | 291 | 34 | -3.30295 |
| 31 | 1424250 | 56 | 211 | 81 | 0 |
| 32 | 1424225 | 143 | 459 | 39 | -14.2431 |
| 33 | 1424200 | 483 | 310 | 34 | -2.68568 |
| 34 | 1424175 | 44 | 270 | 119 | 1.86826 |
| 35 | 1424150 | 98 | 347 | 46 | 2.31744 |
| 36 | 1424125 | 194 | 253 | 39 | 1.62323 |
| 37 | 1424100 | 51 | 101 | 188 | 0 |
| 38 | 1424075 | 64 | 519 | 58 | 12.0152 |
| 39 | 1424050 | 40 | 356 | 145 | 2.00634 |
| 40 | 1424025 | 63 | 88 | 132 | 1.91052 |
| 41 | 1424000 | 126 | 89 | 64 | 0 |
| 42 | 1423975 | 53 | 427 | 74 | 16.4492 |
| 43 | 1423950 | 35 | 406 | 284 | -1.41137 |
| 44 | 1423925 | 39 | 182 | 288 | 7.62417 |
| 45 | 1423900 | 338 | 470 | 34 | .2109 |
| 46 | 1423875 | 64 | 480 | 59 | .428506 |
| 47 | 1423850 | 48 | 92 | 342 | -.377111 |
| 48 | 1423825 | 110 | 98 | 65 | 15.3693 |
| 49 | 1423800 | 126 | 113 | 56 | 0 |
| 50 | 1423775 | 64 | 298 | 64 | 3.03276 |
| 51 | 1423750 | 134 | 133 | 51 | 0 |
| 52 | 1423725 | 41 | 463 | 126 | 0 |
| 53 | 1423700 | 35 | 255 | 530 | -5.95389 |
| 54 | 1423675 | 124 | 501 | 41 | 0 |
| 55 | 1423650 | 500 | 265 | 35 | 3.92943 |
| 56 | 1423625 | 188 | 109 | 50 | -5.55778 |
| 57 | 1423600 | 192 | 352 | 38 | .48377 |

FIG. 18A

| | | | | | |
|---|---|---|---|---|---|
| 58 | 1423575 | 126 | 111 | 57 | 0 |
| 59 | 1423550 | 401 | 426 | 34 | 0 |
| 60 | 1423525 | 519 | 505 | 33 | -2.80095 |
| 61 | 1423500 | 78 | 511 | 51 | 0 |
| 62 | 1423475 | 34 | 520 | 349 | .184558 |
| 63 | 1423450 | 166 | 126 | 49 | 0 |
| 64 | 1423425 | 196 | 354 | 38 | 6.03676 |
| 65 | 1423400 | 340 | 288 | 36 | -9.6909 |
| 66 | 1423375 | 447 | 403 | 34 | 2.78875 |
| 67 | 1423350 | 39 | 347 | 176 | 6.51919 |
| 68 | 1423325 | 206 | 333 | 38 | -7.34646 |
| 69 | 1423300 | 51 | 86 | 331 | 0 |
| 70 | 1423275 | 541 | 531 | 33 | 14.7406 |
| 71 | 1423250 | 240 | 231 | 39 | -2.39365 |
| 72 | 1423225 | 36 | 496 | 234 | -15.328 |
| 73 | 1423200 | 131 | 477 | 41 | 6.06012 |
| 74 | 1423175 | 55 | 98 | 172 | 1.28391 |
| 75 | 1423150 | 34 | 532 | 373 | -4.38747 |
| 76 | 1423125 | 51 | 207 | 103 | 0 |
| 77 | 1423100 | 76 | 321 | 56 | 0 |
| 78 | 1423075 | 37 | 305 | 272 | -3.77635 |
| 79 | 1423050 | 36 | 395 | 275 | .793974 |
| 80 | 1423025 | 36 | 336 | 315 | -2.37665 |
| 81 | 1423000 | 339 | 253 | 37 | .978366 |
| 82 | 1422975 | 383 | 234 | 37 | 3.93232 |
| 83 | 1422950 | 65 | 361 | 63 | -6.3004 |
| 84 | 1422925 | 50 | 89 | 363 | -5.63761 |
| 85 | 1422900 | 51 | 93 | 276 | 0 |
| 86 | 1422875 | 46 | 402 | 103 | -2.03739 |
| 87 | 1422850 | 97 | 428 | 47 | -4.66687 |
| 88 | 1422825 | 44 | 433 | 113 | -6.53685 |
| 89 | 1422800 | 44 | 452 | 112 | 2.04402 |
| 90 | 1422775 | 245 | 245 | 39 | 2.74049 |

FIG. 18B

| | | | | | |
|---|---|---|---|---|---|
| 91 | 1422750 | 36 | 441 | 271 | 0 |
| 92 | 1422725 | 67 | 440 | 60 | 8.68692 |
| 93 | 1422700 | 485 | 458 | 34 | 4.21964 |
| 94 | 1422675 | 63 | 130 | 97 | -4.68867 |
| 95 | 1422650 | 483 | 333 | 35 | 1.36009 |
| 96 | 1422625 | 485 | 334 | 35 | 2.00735 |
| 97 | 1422600 | 178 | 233 | 42 | 1.4255 |
| 98 | 1422575 | 35 | 430 | 371 | -7.13383 |
| 99 | 1422550 | 39 | 450 | 173 | 7.9055 |
| 100 | 1422525 | 102 | 382 | 47 | -6.69444 |
| 101 | 1422500 | 422 | 293 | 36 | -11.6208 |
| 102 | 1422475 | 482 | 271 | 36 | -2.475 |
| 103 | 1422450 | 37 | 238 | 432 | 1.46847 |
| 104 | 1422425 | 436 | 291 | 36 | -4.24664 |
| 105 | 1422400 | 126 | 127 | 56 | 0 |
| 106 | 1422375 | 179 | 339 | 40 | 4.47495 |
| 107 | 1422350 | 156 | 115 | 54 | -1.60169 |
| 108 | 1422325 | 298 | 263 | 38 | 3.24752 |
| 109 | 1422300 | 431 | 301 | 36 | 0 |
| 110 | 1422275 | 351 | 234 | 38 | -9.52823 |
| 111 | 1422250 | 68 | 410 | 61 | 3.04103 |
| 112 | 1422225 | 86 | 441 | 51 | 0 |
| 113 | 1422200 | 110 | 160 | 55 | 2.99186 |
| 114 | 1422175 | 257 | 411 | 37 | -15.0851 |
| 115 | 1422150 | 54 | 89 | 269 | -10.5604 |
| 116 | 1422125 | 104 | 100 | 72 | 17.0928 |
| 117 | 1422100 | 220 | 318 | 39 | 13.4189 |
| 118 | 1422075 | 47 | 417 | 103 | -.307397 |
| 119 | 1422050 | 46 | 157 | 190 | -.753704 |
| 120 | 1422025 | 37 | 454 | 249 | -22.8465 |
| 121 | 1422000 | 474 | 301 | 36 | 0 |
| 122 | 1421975 | 409 | 464 | 35 | 3.67445 |
| 123 | 1421950 | 135 | 490 | 42 | 8.82167 |

FIG. 19A

| | | | | | |
|---|---|---|---|---|---|
| 124 | 1421925 | 79 | 269 | 59 | -2.80428 |
| 125 | 1421900 | 484 | 403 | 35 | 15.6931 |
| 126 | 1421875 | 54 | 91 | 265 | 0 |
| 127 | 1421850 | 44 | 124 | 414 | .20601 |
| 128 | 1421825 | 97 | 88 | 86 | 5.63444 |
| 129 | 1421800 | 51 | 99 | 285 | 3.59299 |
| 130 | 1421775 | 51 | 89 | 426 | 0 |
| 131 | 1421750 | 51 | 188 | 121 | 0 |
| 132 | 1421725 | 192 | 451 | 39 | 6.88895 |
| 133 | 1421700 | 178 | 409 | 40 | .284048 |
| 134 | 1421675 | 90 | 499 | 50 | -5.45636 |
| 135 | 1421650 | 180 | 323 | 41 | 3.46993 |
| 136 | 1421625 | 51 | 89 | 446 | 0 |
| 137 | 1421600 | 36 | 528 | 307 | 12.7555 |
| 138 | 1421575 | 52 | 89 | 386 | 6.36618 |
| 139 | 1421550 | 78 | 81 | 126 | 0 |
| 140 | 1421525 | 311 | 531 | 36 | 2.17372 |
| 141 | 1421500 | 38 | 473 | 224 | -13.3523 |
| 142 | 1421475 | 37 | 511 | 258 | -6.99372 |
| 143 | 1421450 | 35 | 542 | 419 | -.858403 |
| 144 | 1421425 | 431 | 528 | 35 | 7.07357 |
| 145 | 1421400 | 51 | 103 | 276 | 0 |
| 146 | 1421375 | 166 | 137 | 51 | 0 |
| 147 | 1421350 | 54 | 81 | 491 | 4.81325 |
| 148 | 1421325 | 130 | 413 | 44 | -5.5571 |
| 149 | 1421300 | 148 | 145 | 52 | -1.48207 |
| 150 | 1421275 | 42 | 273 | 188 | -2.10988 |
| 151 | 1421250 | 56 | 81 | 379 | 0 |
| 152 | 1421225 | 47 | 399 | 111 | -10.9242 |
| 153 | 1421200 | 51 | 266 | 106 | 0 |
| 154 | 1421175 | 523 | 340 | 36 | -.363282 |
| 155 | 1421150 | 499 | 231 | 38 | 6.37096 |
| 156 | 1421125 | 44 | 417 | 132 | 1.70697 |

FIG. 19B

| | | | | | |
|---|---|---|---|---|---|
| 157 | 1421100 | 37 | 327 | 398 | .257555 |
| 158 | 1421075 | 204 | 128 | 50 | -4.61105 |
| 159 | 1421050 | 311 | 328 | 38 | 6.53213 |
| 160 | 1421025 | 55 | 545 | 79 | -1.65843 |
| 161 | 1421000 | 133 | 126 | 58 | 0 |
| 162 | 1420975 | 52 | 104 | 263 | -.835582 |
| 163 | 1420950 | 61 | 79 | 278 | -6.17113 |
| 164 | 1420925 | 453 | 252 | 38 | -6.02708 |
| 165 | 1420900 | 536 | 233 | 38 | -.870997 |
| 166 | 1420875 | 36 | 421 | 441 | 0 |
| 167 | 1420850 | 196 | 142 | 49 | -3.03085 |
| 168 | 1420825 | 126 | 353 | 46 | 0 |
| 169 | 1420800 | 126 | 111 | 64 | 0 |
| 170 | 1420775 | 54 | 94 | 298 | -5.07202 |
| 171 | 1420750 | 199 | 134 | 50 | -4.26236 |
| 172 | 1420725 | 130 | 500 | 44 | 9.36613 |
| 173 | 1420700 | 487 | 309 | 37 | 13.4725 |
| 174 | 1420675 | 67 | 529 | 64 | -4.00834 |
| 175 | 1420650 | 276 | 231 | 41 | 0 |
| 176 | 1420625 | 138 | 544 | 43 | 1.20022 |
| 177 | 1420600 | 138 | 169 | 52 | 8.17845 |
| 178 | 1420575 | 333 | 234 | 40 | -3.87817 |
| 179 | 1420550 | 68 | 279 | 71 | .766977 |
| 180 | 1420525 | 64 | 77 | 267 | 3.29772 |
| 181 | 1420500 | 545 | 393 | 36 | -8.03893 |
| 182 | 1420475 | 138 | 440 | 44 | .299673 |
| 183 | 1420450 | 48 | 482 | 107 | -2.54555 |
| 184 | 1420425 | 306 | 391 | 38 | -2.55615 |
| 185 | 1420400 | 126 | 106 | 67 | 0 |
| 186 | 1420375 | 533 | 414 | 36 | -3.57604 |
| 187 | 1420350 | 125 | 344 | 47 | 2.65785 |
| 188 | 1420325 | 37 | 405 | 391 | 4.76009 |
| 189 | 1420300 | 131 | 97 | 70 | -16.2579 |

FIG. 20A

| | | | | | |
|---|---|---|---|---|---|
| 190 | 1420275 | 217 | 407 | 40 | 5.73075 |
| 191 | 1420250 | 276 | 247 | 41 | 0 |
| 192 | 1420225 | 418 | 390 | 37 | -2.51727 |
| 193 | 1420200 | 36 | 526 | 441 | 0 |
| 194 | 1420175 | 43 | 163 | 379 | -.155526 |
| 195 | 1420150 | 120 | 76 | 94 | 4.51794 |
| 196 | 1420125 | 541 | 441 | 36 | 0 |
| 197 | 1420100 | 46 | 163 | 242 | -6.26106 |
| 198 | 1420075 | 333 | 220 | 41 | 8.25219 |
| 199 | 1420050 | 306 | 335 | 39 | .774982 |
| 200 | 1420025 | 544 | 453 | 36 | -5.06387 |
| 201 | 1420000 | 106 | 213 | 56 | 0 |
| 202 | 1419975 | 364 | 362 | 38 | 1.07763 |
| 203 | 1419950 | 210 | 482 | 40 | -2.94595 |
| 204 | 1419925 | 41 | 506 | 183 | 5.4401 |
| 205 | 1419900 | 93 | 222 | 60 | 1.00034 |
| 206 | 1419875 | 51 | 111 | 307 | 0 |
| 207 | 1419850 | 64 | 365 | 74 | 8.72144 |
| 208 | 1419825 | 136 | 104 | 67 | -2.99652 |
| 209 | 1419800 | 549 | 484 | 36 | 1.29535 |
| 210 | 1419775 | 61 | 133 | 126 | 0 |
| 211 | 1419750 | 403 | 467 | 37 | -3.41046 |
| 212 | 1419725 | 87 | 412 | 56 | -4.24376 |
| 213 | 1419700 | 156 | 493 | 43 | 7.49316 |
| 214 | 1419675 | 72 | 447 | 64 | -.676706 |
| 215 | 1419650 | 84 | 347 | 59 | 2.76169 |
| 216 | 1419625 | 41 | 277 | 276 | 0 |
| 217 | 1419600 | 56 | 91 | 351 | 0 |
| 218 | 1419575 | 64 | 78 | 308 | 3.87777 |
| 219 | 1419550 | 40 | 285 | 328 | 1.82227 |
| 220 | 1419525 | 318 | 365 | 39 | -5.33669 |
| 221 | 1419500 | 51 | 167 | 166 | 0 |

FIG. 20B

| | | | | | |
|---|---|---|---|---|---|
| 222 | 1419475 | 208 | 84 | 67 | -1.4551 |
| 223 | 1419450 | 207 | 439 | 41 | 2.49368 |
| 224 | 1419425 | 58 | 159 | 124 | 9.61419 |
| 225 | 1419400 | 188 | 151 | 51 | 0 |
| 226 | 1419375 | 39 | 482 | 270 | -9.91502 |
| 227 | 1419350 | 106 | 167 | 62 | .470265 |
| 228 | 1419325 | 58 | 179 | 115 | -4.06348 |
| 229 | 1419300 | 171 | 166 | 51 | 0 |
| 230 | 1419275 | 440 | 496 | 37 | -7.73363 |
| 231 | 1419250 | 60 | 93 | 247 | -4.49341 |
| 232 | 1419225 | 491 | 275 | 39 | 3.52811 |
| 233 | 1419200 | 469 | 353 | 38 | .721876 |
| 234 | 1419175 | 543 | 322 | 38 | -3.19232 |
| 235 | 1419150 | 46 | 129 | 543 | 5.76568 |
| 236 | 1419125 | 40 | 463 | 244 | .628087 |
| 237 | 1419100 | 47 | 398 | 133 | 1.82528 |
| 238 | 1419075 | 51 | 106 | 441 | 0 |
| 239 | 1419050 | 56 | 101 | 281 | 0 |
| 240 | 1419025 | 112 | 108 | 76 | -6.31473 |
| 241 | 1419000 | 64 | 129 | 126 | 0 |
| 242 | 1418975 | 42 | 543 | 181 | -2.25002 |
| 243 | 1418950 | 48 | 527 | 118 | -6.11933 |
| 244 | 1418925 | 445 | 311 | 39 | -13.1923 |
| 245 | 1418900 | 160 | 315 | 46 | 28.0415 |
| 246 | 1418875 | 42 | 198 | 445 | -.418271 |
| 247 | 1418850 | 40 | 403 | 279 | 5.36884 |
| 248 | 1418825 | 41 | 238 | 405 | -1.56661 |
| 249 | 1418800 | 60 | 439 | 82 | -1.14657 |
| 250 | 1418775 | 183 | 140 | 54 | 5.48183 |
| 251 | 1418750 | 56 | 113 | 227 | 0 |
| 252 | 1418725 | 201 | 126 | 55 | 0 |
| 253 | 1418700 | 53 | 113 | 239 | -1.49808 |
| 254 | 1418675 | 380 | 302 | 40 | -2.77023 |
| 255 | 1418650 | 220 | 88 | 66 | -.605598 |

FIG. 21A

| | | | | | |
|---|---|---|---|---|---|
| 256 | 1418625 | 126 | 97 | 78 | 0 |
| 257 | 1418600 | 41 | 276 | 346 | 0 |
| 258 | 1418575 | 72 | 77 | 242 | -.999665 |
| 259 | 1418550 | 193 | 126 | 56 | 0 |
| 260 | 1418525 | 40 | 514 | 257 | -.624781 |
| 261 | 1418500 | 40 | 288 | 426 | -7.88308 |
| 262 | 1418475 | 59 | 94 | 300 | -5.67334 |
| 263 | 1418450 | 178 | 109 | 62 | 1.88667 |
| 264 | 1418425 | 459 | 341 | 39 | -2.8729 |
| 265 | 1418400 | 126 | 197 | 56 | 0 |
| 266 | 1418375 | 393 | 395 | 39 | 6.98583 |
| 267 | 1418350 | 99 | 544 | 53 | -.433663 |
| 268 | 1418325 | 65 | 88 | 245 | -1.17769 |
| 269 | 1418300 | 488 | 438 | 38 | -6.99744 |
| 270 | 1418275 | 139 | 94 | 77 | -7.58676 |
| 271 | 1418250 | 61 | 93 | 276 | 0 |
| 272 | 1418225 | 274 | 506 | 40 | -.860187 |
| 273 | 1418200 | 98 | 504 | 54 | -.541393 |
| 274 | 1418175 | 51 | 191 | 171 | 0 |
| 275 | 1418150 | 452 | 251 | 41 | 0 |
| 276 | 1418125 | 38 | 428 | 534 | 1.70707 |
| 277 | 1418100 | 449 | 302 | 40 | .608472 |
| 278 | 1418075 | 450 | 255 | 41 | 1.75368 |
| 279 | 1418050 | 57 | 547 | 89 | -2.4529 |
| 280 | 1418025 | 51 | 511 | 111 | 0 |
| 281 | 1418000 | 440 | 541 | 38 | -4.56037 |
| 282 | 1417975 | 109 | 312 | 55 | -4.30048 |
| 283 | 1417950 | 411 | 276 | 41 | 0 |
| 284 | 1417925 | 40 | 407 | 338 | 7.43058 |
| 285 | 1417900 | 167 | 143 | 57 | -1.66663 |
| 286 | 1417875 | 199 | 126 | 57 | 0 |
| 287 | 1417850 | 48 | 150 | 340 | 1.45323 |
| 288 | 1417825 | 58 | 108 | 252 | -10.8273 |
| 289 | 1417800 | 51 | 139 | 276 | 0 |

FIG. 21B

| 291 | 1417750 | 88  | 478 | 59  | 8.51703  |
| --- | ------- | --- | --- | --- | -------- |
| 292 | 1417725 | 409 | 460 | 39  | -6.23917 |
| 293 | 1417700 | 526 | 298 | 40  | 4.52223  |
| 294 | 1417675 | 101 | 442 | 55  | -2.09961 |
| 295 | 1417650 | 59  | 89  | 465 | -2.78686 |
| 296 | 1417625 | 38  | 535 | 503 | -.554518 |
| 297 | 1417600 | 42  | 527 | 222 | 2.85349  |
| 298 | 1417575 | 461 | 276 | 41  | 0        |
| 299 | 1417550 | 142 | 425 | 48  | 11.5309  |
| 300 | 1417525 | 536 | 257 | 41  | -7.3014  |
| 301 | 1417500 | 456 | 441 | 39  | 0        |
| 302 | 1417475 | 49  | 317 | 151 | -2.19761 |
| 303 | 1417450 | 182 | 525 | 44  | -1.12792 |
| 304 | 1417425 | 42  | 462 | 243 | -3.96804 |
| 305 | 1417400 | 200 | 90  | 71  | -1.6132  |
| 306 | 1417375 | 51  | 161 | 232 | 0        |
| 307 | 1417350 | 124 | 314 | 53  | -1.09893 |
| 308 | 1417325 | 126 | 91  | 89  | 0        |
| 309 | 1417300 | 132 | 118 | 71  | -2.79619 |
| 310 | 1417275 | 48  | 343 | 159 | -8.15059 |
| 311 | 1417250 | 414 | 396 | 40  | 11.1988  |
| 312 | 1417225 | 41  | 485 | 287 | 1.98665  |
| 313 | 1417200 | 536 | 329 | 40  | -2.33791 |
| 314 | 1417175 | 92  | 214 | 69  | 4.32459  |
| 315 | 1417150 | 65  | 84  | 369 | -2.86472 |
| 316 | 1417125 | 42  | 444 | 262 | -.237315 |
| 317 | 1417100 | 39  | 506 | 454 | -.345102 |
| 318 | 1417075 | 47  | 261 | 209 | 4.42179  |
| 319 | 1417050 | 67  | 81  | 376 | 0        |
| 320 | 1417025 | 202 | 375 | 45  | -1.99537 |
| 321 | 1417000 | 109 | 78  | 126 | 0        |

FIG. 22A

| | | | | | |
|---|---|---|---|---|---|
| 322 | 1416975 | 92 | 489 | 59 | -1.3977 |
| 323 | 1416950 | 48 | 518 | 142 | -1.44477 |
| 324 | 1416925 | 190 | 308 | 47 | 2.49152 |
| 325 | 1416900 | 52 | 125 | 390 | 3.41458 |
| 326 | 1416875 | 304 | 384 | 42 | .394072 |
| 327 | 1416850 | 146 | 118 | 69 | -2.60051 |
| 328 | 1416825 | 289 | 417 | 42 | .73288 |
| 329 | 1416800 | 276 | 451 | 42 | 0 |
| 330 | 1416775 | 475 | 269 | 42 | -3.11041 |
| 331 | 1416750 | 42 | 412 | 296 | .754369 |
| 332 | 1416725 | 58 | 108 | 313 | .945931 |
| 333 | 1416700 | 42 | 359 | 335 | -.326367 |
| 334 | 1416675 | 347 | 291 | 43 | -1.42373 |
| 335 | 1416650 | 386 | 318 | 42 | 3.84704 |
| 336 | 1416625 | 312 | 398 | 42 | -1.20996 |
| 337 | 1416600 | 58 | 195 | 138 | 2.37632 |
| 338 | 1416575 | 59 | 365 | 101 | 7.10496 |
| 339 | 1416550 | 224 | 434 | 44 | 2.97444 |
| 340 | 1416525 | 151 | 303 | 51 | 0 |
| 341 | 1416500 | 228 | 426 | 44 | 3.01319 |
| 342 | 1416475 | 50 | 219 | 203 | 5.51497 |
| 343 | 1416450 | 51 | 133 | 426 | 0 |
| 344 | 1416425 | 192 | 339 | 47 | -1.04389 |
| 345 | 1416400 | 157 | 326 | 50 | 8.05056 |
| 346 | 1416375 | 40 | 459 | 466 | -4.06341 |
| 347 | 1416350 | 40 | 532 | 412 | -3.09585 |
| 348 | 1416325 | 410 | 326 | 42 | 4.7019 |
| 349 | 1416300 | 368 | 258 | 44 | -3.1807 |
| 350 | 1416275 | 428 | 319 | 42 | .565811 |
| 351 | 1416250 | 136 | 81 | 103 | 0 |
| 352 | 1416225 | 249 | 329 | 45 | 1.84402 |
| 353 | 1416200 | 109 | 100 | 98 | 8.485 |
| 354 | 1416175 | 48 | 387 | 171 | -11.5105 |
| 355 | 1416150 | 184 | 79 | 89 | 7.00575 |

FIG. 22B

| | | | | | |
|---|---|---|---|---|---|
| 356 | 1416125 | 207 | 378 | 46 | -3.21908 |
| 357 | 1416100 | 51 | 136 | 441 | 0 |
| 358 | 1416075 | 106 | 195 | 68 | -.549535 |
| 359 | 1416050 | 178 | 112 | 68 | 1.10153 |
| 360 | 1416025 | 44 | 251 | 414 | -1.40774 |
| 361 | 1416000 | 64 | 177 | 126 | 0 |
| 362 | 1415975 | 76 | 81 | 271 | 0 |
| 363 | 1415950 | 40 | 480 | 515 | 4.40532 |
| 364 | 1415925 | 55 | 119 | 394 | -11.4608 |
| 365 | 1415900 | 177 | 218 | 53 | -2.21553 |
| 366 | 1415875 | 51 | 188 | 241 | 0 |
| 367 | 1415850 | 53 | 206 | 187 | -2.01739 |
| 368 | 1415825 | 150 | 159 | 62 | -13.1262 |
| 369 | 1415800 | 54 | 131 | 347 | .838947 |
| 370 | 1415775 | 160 | 78 | 100 | -.680661 |
| 371 | 1415750 | 307 | 415 | 43 | 7.70571 |
| 372 | 1415725 | 48 | 298 | 210 | .848349 |
| 373 | 1415700 | 51 | 143 | 426 | 0 |
| 374 | 1415675 | 55 | 158 | 225 | 1.89566 |
| 375 | 1415650 | 41 | 424 | 481 | 4.92514 |
| 376 | 1415625 | 151 | 144 | 65 | 0 |
| 377 | 1415600 | 174 | 547 | 47 | 2.48558 |
| 378 | 1415575 | 542 | 522 | 40 | 1.63065 |
| 379 | 1415550 | 46 | 194 | 522 | -8.45325 |
| 380 | 1415525 | 363 | 457 | 42 | .709225 |
| 381 | 1415500 | 76 | 149 | 111 | 0 |
| 382 | 1415475 | 203 | 478 | 46 | 3.86307 |
| 383 | 1415450 | 126 | 102 | 90 | 5.56235 |
| 384 | 1415425 | 53 | 528 | 125 | 9.0639 |
| 385 | 1415400 | 126 | 337 | 56 | 0 |
| 386 | 1415375 | 201 | 91 | 78 | 0 |
| 387 | 1415350 | 43 | 428 | 328 | 2.77947 |

FIG. 23A

| | | | | | |
|---|---|---|---|---|---|
| 388 | 1415325 | 501 | 452 | 41 | 0 |
| 389 | 1415300 | 62 | 268 | 113 | 1.75425 |
| 390 | 1415275 | 283 | 262 | 47 | -1.38819 |
| 391 | 1415250 | 51 | 185 | 276 | 0 |
| 392 | 1415225 | 43 | 391 | 365 | -8.88916 |
| 393 | 1415200 | 61 | 116 | 276 | 0 |
| 394 | 1415175 | 425 | 290 | 44 | .645278 |
| 395 | 1415150 | 51 | 166 | 341 | 0 |
| 396 | 1415125 | 43 | 548 | 294 | -7.01936 |
| 397 | 1415100 | 126 | 105 | 89 | 0 |
| 398 | 1415075 | 321 | 276 | 46 | 0 |
| 399 | 1415050 | 499 | 384 | 42 | 1.87977 |
| 400 | 1415025 | 76 | 81 | 331 | 0 |
| 401 | 1415000 | 51 | 188 | 283 | 0 |
| 402 | 1414975 | 248 | 227 | 50 | -4.36884 |
| 403 | 1414950 | 310 | 292 | 46 | 1.79174 |
| 404 | 1414925 | 182 | 486 | 48 | -4.15061 |
| 405 | 1414900 | 539 | 487 | 41 | 5.06754 |
| 406 | 1414875 | 51 | 511 | 147 | 0 |
| 407 | 1414850 | 542 | 493 | 41 | -7.70179 |
| 408 | 1414825 | 497 | 333 | 43 | -.607268 |
| 409 | 1414800 | 126 | 131 | 78 | 0 |
| 410 | 1414775 | 147 | 105 | 83 | .160631 |
| 411 | 1414750 | 59 | 398 | 113 | .775521 |
| 412 | 1414725 | 71 | 87 | 366 | -3.41328 |
| 413 | 1414700 | 51 | 188 | 301 | 0 |
| 414 | 1414675 | 208 | 333 | 49 | -4.36529 |
| 415 | 1414650 | 46 | 462 | 234 | 4.18944 |
| 416 | 1414625 | 495 | 437 | 42 | -2.15157 |
| 417 | 1414600 | 58 | 147 | 240 | -6.63664 |
| 418 | 1414575 | 65 | 100 | 355 | 3.92341 |
| 419 | 1414550 | 54 | 259 | 173 | 1.02044 |
| 420 | 1414525 | 53 | 142 | 450 | -3.73625 |
| 421 | 1414500 | 82 | 81 | 276 | 0 |

FIG. 23B

| | | | | | |
|---|---|---|---|---|---|
| 422 | 1414475 | 66 | 179 | 135 | .322502 |
| 423 | 1414450 | 190 | 109 | 73 | -3.53822 |
| 424 | 1414425 | 74 | 90 | 287 | -.887984 |
| 425 | 1414400 | 51 | 166 | 416 | 0 |
| 426 | 1414375 | 73 | 93 | 276 | 0 |
| 427 | 1414350 | 56 | 126 | 449 | 0 |
| 428 | 1414325 | 120 | 366 | 59 | -12.0076 |
| 429 | 1414300 | 68 | 107 | 252 | 4.82441 |
| 430 | 1414275 | 67 | 94 | 412 | -.218019 |
| 431 | 1414250 | 293 | 311 | 47 | -3.60237 |
| 432 | 1414225 | 68 | 92 | 420 | -1.30155 |
| 433 | 1414200 | 71 | 102 | 246 | 17.3195 |
| 434 | 1414175 | 382 | 334 | 45 | -1.77343 |
| 435 | 1414150 | 43 | 385 | 515 | -2.19547 |
| 436 | 1414125 | 76 | 81 | 419 | 0 |
| 437 | 1414100 | 407 | 246 | 47 | -1.7484 |
| 438 | 1414075 | 524 | 497 | 42 | 6.73203 |
| 439 | 1414050 | 54 | 285 | 173 | 5.0986 |
| 440 | 1414025 | 44 | 345 | 478 | -4.16679 |
| 441 | 1414000 | 144 | 101 | 91 | 0 |
| 442 | 1413975 | 60 | 144 | 240 | -4.5005 |
| 443 | 1413950 | 341 | 287 | 47 | 7.37753 |
| 444 | 1413925 | 295 | 394 | 46 | 1.1059 |
| 445 | 1413900 | 550 | 393 | 43 | 8.89505 |
| 446 | 1413875 | 54 | 227 | 210 | 1.09851 |
| 447 | 1413850 | 56 | 447 | 132 | 1.71157 |
| 448 | 1413825 | 547 | 331 | 44 | .709884 |
| 449 | 1413800 | 49 | 223 | 369 | 1.37706 |
| 450 | 1413775 | 126 | 106 | 97 | 0 |
| 451 | 1413750 | 51 | 188 | 377 | 0 |
| 452 | 1413725 | 44 | 516 | 352 | -2.07452 |
| 453 | 1413700 | 67 | 211 | 126 | 0 |

FIG. 24A

| | | | | | |
|---|---|---|---|---|---|
| 454 | 1413675 | 126 | 309 | 61 | 0 |
| 455 | 1413650 | 134 | 532 | 55 | 3.48748 |
| 456 | 1413625 | 526 | 441 | 43 | 0 |
| 457 | 1413600 | 171 | 496 | 51 | 0 |
| 458 | 1413575 | 70 | 91 | 449 | -5.03221 |
| 459 | 1413550 | 412 | 309 | 46 | 5.79307 |
| 460 | 1413525 | 51 | 188 | 401 | 0 |
| 461 | 1413500 | 64 | 126 | 257 | 0 |
| 462 | 1413475 | 465 | 337 | 45 | .962131 |
| 463 | 1413450 | 102 | 407 | 66 | -1.68831 |
| 464 | 1413425 | 122 | 516 | 58 | -1.16133 |
| 465 | 1413400 | 191 | 111 | 76 | 0 |
| 466 | 1413375 | 53 | 155 | 499 | 2.75829 |
| 467 | 1413350 | 51 | 403 | 192 | -3.90717 |
| 468 | 1413325 | 56 | 166 | 292 | -2.60335 |
| 469 | 1413300 | 77 | 279 | 93 | -2.16074 |
| 470 | 1413275 | 43 | 512 | 508 | -1.71396 |
| 471 | 1413250 | 141 | 382 | 57 | 10.0434 |
| 472 | 1413225 | 94 | 524 | 68 | .590706 |
| 473 | 1413200 | 64 | 110 | 397 | -6.47218 |
| 474 | 1413175 | 428 | 283 | 47 | .848522 |
| 475 | 1413150 | 514 | 256 | 47 | -1.08018 |
| 476 | 1413125 | 51 | 217 | 342 | 0 |
| 477 | 1413100 | 380 | 223 | 50 | -4.31749 |
| 478 | 1413075 | 152 | 145 | 73 | 1.02199 |
| 479 | 1413050 | 158 | 527 | 53 | -1.11777 |
| 480 | 1413025 | 73 | 174 | 130 | -10.8288 |
| 481 | 1413000 | 51 | 188 | 471 | 0 |
| 482 | 1412975 | 481 | 274 | 47 | -4.31332 |
| 483 | 1412950 | 61 | 126 | 367 | 0 |
| 484 | 1412925 | 57 | 188 | 240 | -2.63704 |
| 485 | 1412900 | 51 | 199 | 426 | 0 |
| 486 | 1412875 | 89 | 127 | 126 | 0 |
| 487 | 1412850 | 99 | 332 | 72 | 4.03804 |

FIG. 24B

| | | | | | |
|---|---|---|---|---|---|
| 488 | 1412825 | 60 | 212 | 179 | -.157948 |
| 489 | 1412800 | 204 | 108 | 78 | 10.5231 |
| 490 | 1412775 | 273 | 276 | 51 | 0 |
| 491 | 1412750 | 59 | 173 | 239 | -1.26354 |
| 492 | 1412725 | 160 | 409 | 55 | -1.4844 |
| 493 | 1412700 | 277 | 276 | 51 | 0 |
| 494 | 1412675 | 130 | 522 | 58 | 5.81454 |
| 495 | 1412650 | 97 | 81 | 237 | -1.65519 |
| 496 | 1412625 | 64 | 132 | 275 | -4.31164 |
| 497 | 1412600 | 55 | 294 | 192 | 8.33884 |
| 498 | 1412575 | 472 | 541 | 44 | -.320026 |
| 499 | 1412550 | 57 | 150 | 392 | 7.72413 |
| 500 | 1412525 | 100 | 486 | 68 | -3.84675 |
| 501 | 1412500 | 64 | 441 | 113 | 0 |
| 502 | 1412475 | 51 | 209 | 437 | 3.30805 |
| 503 | 1412450 | 66 | 107 | 452 | 1.76997 |
| 504 | 1412425 | 461 | 453 | 45 | -1.20239 |
| 505 | 1412400 | 126 | 107 | 106 | 0 |
| 506 | 1412375 | 65 | 262 | 134 | -1.80048 |
| 507 | 1412350 | 59 | 175 | 252 | -5.44789 |
| 508 | 1412325 | 63 | 125 | 364 | 7.09488 |
| 509 | 1412300 | 66 | 289 | 125 | -2.58478 |
| 510 | 1412275 | 428 | 517 | 45 | 1.36158 |
| 511 | 1412250 | 67 | 269 | 126 | 0 |
| 512 | 1412225 | 425 | 421 | 46 | 1.24788 |
| 513 | 1412200 | 307 | 276 | 51 | 0 |
| 514 | 1412175 | 58 | 228 | 205 | -2.15945 |
| 515 | 1412150 | 61 | 126 | 463 | 0 |
| 516 | 1412125 | 65 | 316 | 126 | 0 |
| 517 | 1412100 | 46 | 488 | 386 | 3.25935 |
| 518 | 1412075 | 122 | 542 | 61 | -1.40032 |
| 519 | 1412050 | 45 | 480 | 493 | -2.54595 |

FIG. 25A

| | | | | | |
|---|---|---|---|---|---|
| 520 | 1412025 | 56 | 201 | 281 | 0 |
| 521 | 1412000 | 64 | 126 | 353 | 0 |
| 522 | 1411975 | 267 | 388 | 50 | -1.57608 |
| 523 | 1411950 | 55 | 209 | 297 | 1.62422 |
| 524 | 1411925 | 450 | 274 | 49 | -4.28302 |
| 525 | 1411900 | 343 | 222 | 53 | -2.13726 |
| 526 | 1411875 | 265 | 251 | 54 | 0 |
| 527 | 1411850 | 151 | 476 | 57 | 0 |
| 528 | 1411825 | 90 | 80 | 374 | 2.85027 |
| 529 | 1411800 | 78 | 181 | 126 | 0 |
| 530 | 1411775 | 451 | 456 | 46 | -10.175 |
| 531 | 1411750 | 530 | 259 | 49 | -.30529 |
| 532 | 1411725 | 63 | 140 | 314 | 5.06036 |
| 533 | 1411700 | 63 | 132 | 366 | .337322 |
| 534 | 1411675 | 54 | 248 | 279 | 1.14033 |
| 535 | 1411650 | 488 | 440 | 46 | -2.05287 |
| 536 | 1411625 | 491 | 276 | 49 | 0 |
| 537 | 1411600 | 186 | 315 | 57 | 4.30367 |
| 538 | 1411575 | 131 | 209 | 73 | 5.65007 |
| 539 | 1411550 | 126 | 111 | 109 | 0 |
| 540 | 1411525 | 94 | 75 | 477 | 4.21267 |
| 541 | 1411500 | 524 | 273 | 49 | 1.7574 |
| 542 | 1411475 | 86 | 101 | 221 | 0 |
| 543 | 1411450 | 47 | 525 | 364 | -4.52584 |
| 544 | 1411425 | 369 | 276 | 51 | 0 |
| 545 | 1411400 | 86 | 540 | 80 | -3.03919 |
| 546 | 1411375 | 319 | 522 | 48 | .096316 |
| 547 | 1411350 | 458 | 417 | 47 | 2.8816 |
| 548 | 1411325 | 80 | 390 | 92 | .116216 |
| 549 | 1411300 | 68 | 125 | 312 | 1.70293 |
| 550 | 1411275 | 182 | 459 | 55 | -.603151 |
| 551 | 1411250 | 57 | 213 | 277 | -4.57782 |
| 552 | 1411225 | 63 | 223 | 182 | 5.17805 |
| 553 | 1411200 | 51 | 392 | 276 | 0 |

FIG. 25B

| | | | | | |
|---|---|---|---|---|---|
| 554 | 1411175 | 439 | 380 | 48 | .0576769 |
| 555 | 1411150 | 507 | 501 | 46 | 0 |
| 556 | 1411125 | 265 | 426 | 51 | 0 |
| 557 | 1411100 | 283 | 301 | 53 | -1.13657 |
| 558 | 1411075 | 78 | 220 | 119 | 5.8045 |
| 559 | 1411050 | 409 | 276 | 51 | 0 |
| 560 | 1411025 | 54 | 349 | 233 | 3.08483 |
| 561 | 1411000 | 61 | 166 | 306 | 0 |
| 562 | 1410975 | 422 | 308 | 50 | .85661 |
| 563 | 1410950 | 190 | 95 | 101 | 11.2575 |
| 564 | 1410925 | 257 | 352 | 53 | -1.36971 |
| 565 | 1410900 | 51 | 360 | 314 | 2.66982 |
| 566 | 1410875 | 251 | 326 | 54 | -7.25689 |
| 567 | 1410850 | 58 | 202 | 296 | -2.14509 |
| 568 | 1410825 | 54 | 213 | 431 | 4.34649 |
| 569 | 1410800 | 122 | 117 | 113 | -2.79893 |
| 570 | 1410775 | 48 | 379 | 503 | -1.98463 |
| 571 | 1410750 | 477 | 266 | 51 | 0 |
| 572 | 1410725 | 60 | 167 | 353 | 2.55258 |
| 573 | 1410700 | 65 | 157 | 268 | -3.90137 |
| 574 | 1410675 | 408 | 394 | 49 | 12.0349 |
| 575 | 1410650 | 68 | 124 | 373 | -2.02241 |
| 576 | 1410625 | 61 | 185 | 276 | 0 |
| 577 | 1410600 | 47 | 541 | 454 | -3.37702 |
| 578 | 1410575 | 67 | 122 | 440 | 1.72569 |
| 579 | 1410550 | 429 | 335 | 50 | -1.94157 |
| 580 | 1410525 | 95 | 82 | 377 | -2.23552 |
| 581 | 1410500 | 93 | 91 | 276 | 0 |
| 582 | 1410475 | 55 | 197 | 492 | -1.27003 |
| 583 | 1410450 | 90 | 88 | 351 | 8.30243 |
| 584 | 1410425 | 61 | 179 | 303 | .930129 |
| 585 | 1410400 | 301 | 246 | 56 | 0 |

FIG. 26A

| | | | | | |
|---|---|---|---|---|---|
| 586 | 1410375 | 106 | 432 | 74 | 1.70268 |
| 587 | 1410350 | 67 | 126 | 421 | 0 |
| 588 | 1410325 | 65 | 139 | 379 | -1.13824 |
| 589 | 1410300 | 187 | 315 | 60 | 3.13422 |
| 590 | 1410275 | 68 | 160 | 236 | .049931 |
| 591 | 1410250 | 135 | 470 | 64 | 1.13657 |
| 592 | 1410225 | 499 | 375 | 49 | .738247 |
| 593 | 1410200 | 472 | 339 | 50 | -5.07647 |
| 594 | 1410175 | 175 | 547 | 57 | .789441 |
| 595 | 1410150 | 474 | 301 | 51 | 0 |
| 596 | 1410125 | 69 | 529 | 115 | -8.06244 |
| 597 | 1410100 | 155 | 454 | 61 | 5.25597 |
| 598 | 1410075 | 74 | 140 | 227 | 5.08019 |
| 599 | 1410050 | 55 | 213 | 473 | 1.44352 |
| 600 | 1410025 | 80 | 193 | 136 | -3.90686 |
| 601 | 1410000 | 153 | 188 | 76 | 0 |
| 602 | 1409975 | 67 | 327 | 143 | 4.3204 |
| 603 | 1409950 | 212 | 336 | 58 | -.558445 |
| 604 | 1409925 | 65 | 178 | 254 | -3.0705 |
| 605 | 1409900 | 64 | 159 | 333 | 2.1787 |
| 606 | 1409875 | 65 | 139 | 431 | 1.31657 |
| 607 | 1409850 | 241 | 351 | 56 | 0 |
| 608 | 1409825 | 84 | 289 | 105 | 2.8962 |
| 609 | 1409800 | 133 | 126 | 106 | 0 |
| 610 | 1409775 | 56 | 432 | 216 | 4.04684 |
| 611 | 1409750 | 110 | 544 | 72 | .178475 |
| 612 | 1409725 | 321 | 496 | 51 | 0 |
| 613 | 1409700 | 126 | 127 | 111 | 0 |
| 614 | 1409675 | 70 | 499 | 118 | 6.20592 |
| 615 | 1409650 | 341 | 466 | 51 | 0 |
| 616 | 1409625 | 51 | 441 | 358 | 0 |
| 617 | 1409600 | 265 | 235 | 60 | 7.24323 |
| 618 | 1409575 | 65 | 169 | 295 | -2.34097 |
| 619 | 1409550 | 71 | 136 | 308 | -6.03209 |

FIG. 26B

| | | | | | |
|---|---|---|---|---|---|
| 620 | 1409525 | 478 | 480 | 49 | 2.5166 |
| 621 | 1409500 | 65 | 142 | 453 | 1.471 |
| 622 | 1409475 | 191 | 104 | 102 | .379445 |
| 623 | 1409450 | 208 | 122 | 86 | 1.29169 |
| 624 | 1409425 | 79 | 101 | 491 | -6.54108 |
| 625 | 1409400 | 116 | 81 | 276 | 0 |
| 626 | 1409375 | 129 | 82 | 216 | 0 |
| 627 | 1409350 | 426 | 397 | 51 | 0 |
| 628 | 1409325 | 57 | 301 | 276 | 0 |
| 629 | 1409300 | 437 | 274 | 54 | .19022 |
| 630 | 1409275 | 62 | 176 | 376 | -3.9032 |
| 631 | 1409250 | 461 | 449 | 50 | .990303 |
| 632 | 1409225 | 379 | 308 | 54 | -1.53648 |
| 633 | 1409200 | 126 | 78 | 271 | 0 |
| 634 | 1409175 | 55 | 323 | 323 | 2.28615 |
| 635 | 1409150 | 104 | 88 | 291 | 5.19493 |
| 636 | 1409125 | 214 | 116 | 90 | .86007 |
| 637 | 1409100 | 61 | 216 | 301 | 0 |
| 638 | 1409075 | 322 | 513 | 52 | 1.71798 |
| 639 | 1409050 | 69 | 153 | 303 | -1.08923 |
| 640 | 1409025 | 414 | 549 | 50 | 2.78633 |
| 641 | 1409000 | 69 | 133 | 439 | -8.39377 |
| 642 | 1408975 | 491 | 390 | 51 | -1.31158 |
| 643 | 1408950 | 155 | 101 | 126 | 0 |
| 644 | 1408925 | 166 | 97 | 126 | 0 |
| 645 | 1408900 | 511 | 386 | 51 | 0 |
| 646 | 1408875 | 51 | 507 | 391 | 0 |
| 647 | 1408850 | 59 | 292 | 264 | -2.50061 |
| 648 | 1408825 | 545 | 376 | 51 | 0 |
| 649 | 1408800 | 57 | 391 | 249 | -1.66164 |
| 650 | 1408775 | 61 | 525 | 172 | 1.11602 |
| 651 | 1408750 | 343 | 276 | 57 | 0 |

FIG. 27A

| | | | | | |
|---|---|---|---|---|---|
| 652 | 1408725 | 124 | 396 | 74 | .317196 |
| 653 | 1408700 | 50 | 547 | 459 | 3.13384 |
| 654 | 1408675 | 65 | 151 | 489 | 3.20184 |
| 655 | 1408650 | 204 | 162 | 77 | 1.69088 |
| 656 | 1408625 | 191 | 177 | 76 | 0 |
| 657 | 1408600 | 528 | 237 | 56 | -6.43232 |
| 658 | 1408575 | 52 | 382 | 480 | -2.66722 |
| 659 | 1408550 | 197 | 91 | 126 | 0 |
| 660 | 1408525 | 196 | 123 | 93 | -1.37069 |
| 661 | 1408500 | 126 | 313 | 78 | 0 |
| 662 | 1408475 | 116 | 167 | 107 | .741275 |
| 663 | 1408450 | 94 | 437 | 91 | 1.09609 |
| 664 | 1408425 | 126 | 211 | 89 | 0 |
| 665 | 1408400 | 503 | 251 | 56 | 0 |
| 666 | 1408375 | 160 | 131 | 100 | 6.71935 |
| 667 | 1408350 | 416 | 283 | 56 | 4.27241 |
| 668 | 1408325 | 199 | 378 | 62 | 1.0871 |
| 669 | 1408300 | 82 | 119 | 311 | -5.39997 |
| 670 | 1408275 | 124 | 344 | 78 | -7.36482 |
| 671 | 1408250 | 78 | 131 | 301 | 0 |
| 672 | 1408225 | 423 | 227 | 59 | -2.24168 |
| 673 | 1408200 | 65 | 193 | 317 | -2.4208 |
| 674 | 1408175 | 62 | 203 | 379 | -4.65894 |
| 675 | 1408150 | 148 | 82 | 210 | -4.64123 |
| 676 | 1408125 | 483 | 373 | 53 | 1.60878 |
| 677 | 1408100 | 66 | 175 | 359 | -2.96371 |
| 678 | 1408075 | 52 | 487 | 436 | -7.11841 |
| 679 | 1408050 | 126 | 149 | 111 | 0 |
| 680 | 1408025 | 152 | 75 | 270 | -2.27892 |
| 681 | 1408000 | 512 | 511 | 51 | 0 |
| 682 | 1407975 | 84 | 133 | 240 | 3.78081 |
| 683 | 1407950 | 85 | 123 | 272 | 1.29627 |
| 684 | 1407925 | 400 | 474 | 53 | -.336261 |
| 685 | 1407900 | 126 | 78 | 361 | 0 |

FIG. 27B

| | | | | | |
|---|---|---|---|---|---|
| 686 | 1407875 | 68 | 257 | 204 | 4.59525 |
| 687 | 1407850 | 434 | 278 | 57 | -5.41933 |
| 688 | 1407825 | 54 | 438 | 383 | .356033 |
| 689 | 1407800 | 76 | 163 | 240 | 10.3311 |
| 690 | 1407775 | 224 | 440 | 60 | .229401 |
| 691 | 1407750 | 254 | 245 | 65 | 5.56842 |
| 692 | 1407725 | 102 | 131 | 167 | 2.52342 |
| 693 | 1407700 | 139 | 102 | 156 | 1.38864 |
| 694 | 1407675 | 184 | 115 | 108 | -1.81433 |
| 695 | 1407650 | 64 | 550 | 170 | .504687 |
| 696 | 1407625 | 270 | 312 | 61 | -1.49416 |
| 697 | 1407600 | 153 | 76 | 276 | 0 |
| 698 | 1407575 | 426 | 221 | 61 | 0 |
| 699 | 1407550 | 63 | 187 | 492 | .105966 |
| 700 | 1407525 | 284 | 407 | 58 | 3.76383 |
| 701 | 1407500 | 62 | 206 | 448 | 2.23624 |
| 702 | 1407475 | 60 | 396 | 250 | 2.39103 |
| 703 | 1407450 | 198 | 500 | 62 | -.275161 |
| 704 | 1407425 | 458 | 412 | 54 | 2.02665 |
| 705 | 1407400 | 116 | 377 | 84 | 2.22908 |
| 706 | 1407375 | 81 | 139 | 276 | 0 |
| 707 | 1407350 | 63 | 337 | 234 | -1.73058 |
| 708 | 1407325 | 309 | 289 | 61 | 6.2004 |
| 709 | 1407300 | 528 | 440 | 53 | -.0997476 |
| 710 | 1407275 | 446 | 281 | 58 | .704007 |
| 711 | 1407250 | 351 | 433 | 56 | 0 |
| 712 | 1407225 | 68 | 164 | 448 | -2.34038 |
| 713 | 1407200 | 131 | 327 | 81 | 1.47475 |
| 714 | 1407175 | 153 | 76 | 301 | 0 |
| 715 | 1407150 | 126 | 106 | 177 | 0 |
| 716 | 1407125 | 70 | 366 | 168 | .445803 |
| 717 | 1407100 | 157 | 325 | 74 | 1.40932 |

FIG. 28A

| | | | | | |
|---|---|---|---|---|---|
| 718 | 1407075 | 68 | 179 | 379 | -.42147 |
| 719 | 1407050 | 526 | 321 | 56 | 0 |
| 720 | 1407025 | 356 | 238 | 63 | -.143778 |
| 721 | 1407000 | 134 | 133 | 126 | 0 |
| 722 | 1406975 | 501 | 337 | 56 | 0 |
| 723 | 1406950 | 326 | 324 | 60 | -.201824 |
| 724 | 1406925 | 91 | 111 | 351 | 0 |
| 725 | 1406900 | 188 | 125 | 105 | 3.6491 |
| 726 | 1406875 | 173 | 93 | 159 | -1.99985 |
| 727 | 1406850 | 166 | 126 | 113 | 0 |
| 728 | 1406825 | 69 | 239 | 245 | -2.48171 |
| 729 | 1406800 | 459 | 429 | 55 | 3.57099 |
| 730 | 1406775 | 65 | 278 | 268 | 4.73235 |
| 731 | 1406750 | 153 | 76 | 331 | 0 |
| 732 | 1406725 | 196 | 102 | 128 | 2.84856 |
| 733 | 1406700 | 521 | 351 | 56 | 0 |
| 734 | 1406675 | 215 | 114 | 108 | -4.27057 |
| 735 | 1406650 | 486 | 303 | 58 | -5.56967 |
| 736 | 1406625 | 136 | 81 | 341 | 0 |
| 737 | 1406600 | 541 | 351 | 56 | 0 |
| 738 | 1406575 | 142 | 132 | 125 | 2.75061 |
| 739 | 1406550 | 90 | 436 | 109 | -2.15248 |
| 740 | 1406525 | 104 | 546 | 90 | -.425339 |
| 741 | 1406500 | 126 | 97 | 232 | 0 |
| 742 | 1406475 | 376 | 513 | 56 | 0 |
| 743 | 1406450 | 74 | 294 | 179 | 2.86296 |
| 744 | 1406425 | 194 | 94 | 149 | 1.54341 |
| 745 | 1406400 | 83 | 534 | 117 | -3.07699 |
| 746 | 1406375 | 57 | 429 | 396 | -8.45009 |
| 747 | 1406350 | 482 | 297 | 59 | 3.7298 |
| 748 | 1406325 | 76 | 215 | 217 | 2.8845 |
| 749 | 1406300 | 126 | 91 | 287 | 0 |
| 750 | 1406275 | 162 | 76 | 328 | -1.42458 |
| 751 | 1406250 | 153 | 188 | 95 | 0 |

FIG. 28B

| | | | | | |
|---|---|---|---|---|---|
| 752 | 1406225 | 366 | 314 | 61 | 1.09414 |
| 753 | 1406200 | 89 | 316 | 126 | 0 |
| 754 | 1406175 | 142 | 86 | 274 | 4.08783 |
| 755 | 1406150 | 232 | 429 | 64 | 1.05961 |
| 756 | 1406125 | 549 | 350 | 57 | -1.30718 |
| 757 | 1406100 | 94 | 131 | 250 | .332181 |
| 758 | 1406075 | 494 | 285 | 60 | .133161 |
| 759 | 1406050 | 66 | 258 | 315 | -2.19241 |
| 760 | 1406025 | 178 | 537 | 68 | 8.58974 |
| 761 | 1406000 | 185 | 76 | 276 | 0 |
| 762 | 1405975 | 180 | 432 | 70 | .74672 |
| 763 | 1405950 | 126 | 221 | 103 | 0 |
| 764 | 1405925 | 124 | 534 | 82 | .579066 |
| 765 | 1405900 | 520 | 439 | 56 | -.879809 |
| 766 | 1405875 | 163 | 81 | 276 | 0 |
| 767 | 1405850 | 57 | 534 | 383 | -2.13999 |
| 768 | 1405825 | 525 | 316 | 59 | 2.19356 |
| 769 | 1405800 | 213 | 106 | 126 | 0 |
| 770 | 1405775 | 499 | 259 | 62 | 6.51992 |
| 771 | 1405750 | 70 | 252 | 267 | 2.27921 |
| 772 | 1405725 | 394 | 364 | 60 | 5.19492 |
| 773 | 1405700 | 74 | 159 | 462 | -1.54217 |
| 774 | 1405675 | 355 | 369 | 61 | -1.15144 |
| 775 | 1405650 | 528 | 363 | 58 | -3.06232 |
| 776 | 1405625 | 346 | 276 | 65 | 0 |
| 777 | 1405600 | 76 | 251 | 210 | 0 |
| 778 | 1405575 | 300 | 542 | 60 | -2.19253 |
| 779 | 1405550 | 534 | 417 | 57 | .99865 |
| 780 | 1405525 | 76 | 269 | 201 | 0 |
| 781 | 1405500 | 484 | 461 | 57 | -4.82234 |
| 782 | 1405475 | 156 | 311 | 82 | -6.74452 |
| 783 | 1405450 | 550 | 335 | 59 | -5.39716 |

FIG. 29 A

| | | | | | |
|---|---|---|---|---|---|
| 784 | 1405425 | 123 | 289 | 98 | -2.46465 |
| 785 | 1405400 | 134 | 512 | 81 | 2.94278 |
| 786 | 1405375 | 407 | 320 | 62 | .348086 |
| 787 | 1405350 | 59 | 436 | 410 | 2.37425 |
| 788 | 1405325 | 95 | 117 | 378 | .632479 |
| 789 | 1405300 | 65 | 376 | 276 | 0 |
| 790 | 1405275 | 63 | 335 | 359 | -.323735 |
| 791 | 1405250 | 511 | 306 | 61 | 0 |
| 792 | 1405225 | 277 | 268 | 70 | 1.63233 |
| 793 | 1405200 | 170 | 131 | 123 | 6.71557 |
| 794 | 1405175 | 179 | 521 | 71 | -2.3151 |
| 795 | 1405150 | 68 | 417 | 224 | -.257423 |
| 796 | 1405125 | 539 | 368 | 59 | 2.05207 |
| 797 | 1405100 | 197 | 159 | 98 | 6.52486 |
| 798 | 1405075 | 217 | 111 | 126 | 0 |
| 799 | 1405050 | 261 | 221 | 76 | 0 |
| 800 | 1405025 | 59 | 498 | 401 | .867273 |
| 801 | 1405000 | 281 | 441 | 64 | 0 |
| 802 | 1404975 | 91 | 131 | 351 | 0 |
| 803 | 1404950 | 134 | 86 | 424 | -5.38476 |
| 804 | 1404925 | 178 | 476 | 73 | -.825982 |
| 805 | 1404900 | 126 | 89 | 446 | 0 |
| 806 | 1404875 | 427 | 487 | 59 | .333109 |
| 807 | 1404850 | 108 | 279 | 117 | -.115924 |
| 808 | 1404825 | 70 | 202 | 475 | -.540014 |
| 809 | 1404800 | 122 | 98 | 339 | 2.21824 |
| 810 | 1404775 | 63 | 528 | 284 | -.751616 |
| 811 | 1404750 | 92 | 271 | 148 | .692178 |
| 812 | 1404725 | 155 | 79 | 460 | 4.58873 |
| 813 | 1404700 | 74 | 177 | 477 | -.719466 |
| 814 | 1404675 | 115 | 102 | 362 | -2.41787 |
| 815 | 1404650 | 189 | 165 | 101 | 1.62169 |
| 816 | 1404625 | 106 | 109 | 382 | -.578631 |
| 817 | 1404600 | 520 | 505 | 58 | 1.8243 |

FIG. 29 B

| | | | | | |
|---|---|---|---|---|---|
| 818 | 1404575 | 94 | 117 | 500 | -.94739 |
| 819 | 1404550 | 180 | 108 | 157 | -.200812 |
| 820 | 1404525 | 66 | 268 | 447 | -.872056 |
| 821 | 1404500 | 106 | 106 | 441 | 0 |
| 822 | 1404475 | 87 | 275 | 167 | -1.94293 |
| 823 | 1404450 | 91 | 349 | 138 | -2.79666 |
| 824 | 1404425 | 75 | 350 | 205 | -3.75818 |
| 825 | 1404400 | 142 | 87 | 396 | -2.50534 |
| 826 | 1404375 | 106 | 107 | 441 | 0 |
| 827 | 1404350 | 115 | 102 | 395 | -1.19034 |
| 828 | 1404325 | 118 | 379 | 101 | -1.13056 |
| 829 | 1404300 | 151 | 126 | 155 | 0 |
| 830 | 1404275 | 472 | 291 | 65 | 2.74544 |
| 831 | 1404250 | 303 | 447 | 65 | 5.68426 |
| 832 | 1404225 | 236 | 508 | 68 | -3.64851 |
| 833 | 1404200 | 177 | 126 | 136 | 0 |
| 834 | 1404175 | 74 | 189 | 480 | -.258602 |
| 835 | 1404150 | 121 | 111 | 276 | 0 |
| 836 | 1404125 | 434 | 318 | 65 | .455337 |
| 837 | 1404100 | 261 | 545 | 66 | 1.08771 |
| 838 | 1404075 | 126 | 97 | 386 | 0 |
| 839 | 1404050 | 62 | 437 | 425 | .106414 |
| 840 | 1404025 | 441 | 226 | 71 | 0 |
| 841 | 1404000 | 208 | 81 | 276 | .0 |
| 842 | 1403975 | 342 | 322 | 68 | .112492 |
| 843 | 1403950 | 355 | 313 | 68 | -4.97296 |
| 844 | 1403925 | 163 | 480 | 80 | -.0244688 |
| 845 | 1403900 | 158 | 82 | 459 | .927136 |
| 846 | 1403875 | 93 | 534 | 124 | -2.73567 |
| 847 | 1403850 | 191 | 126 | 133 | 0 |
| 848 | 1403825 | 76 | 429 | 194 | 3.63179 |
| 849 | 1403800 | 512 | 331 | 64 | 2.07084 |

FIG. 30A

| | | | | | |
|---|---|---|---|---|---|
| 850 | 1403775 | 486 | 296 | 66 | 3.02423 |
| 851 | 1403750 | 63 | 452 | 404 | -2.44039 |
| 852 | 1403725 | 116 | 104 | 425 | -1.39379 |
| 853 | 1403700 | 198 | 75 | 461 | .894737 |
| 854 | 1403675 | 117 | 125 | 249 | .728856 |
| 855 | 1403650 | 530 | 289 | 66 | 1.21177 |
| 856 | 1403625 | 197 | 133 | 126 | 0 |
| 857 | 1403600 | 126 | 106 | 319 | 0 |
| 858 | 1403575 | 83 | 211 | 271 | -4.30163 |
| 859 | 1403550 | 65 | 312 | 545 | .443304 |
| 860 | 1403525 | 84 | 275 | 204 | 1.44045 |
| 861 | 1403500 | 64 | 441 | 401 | 0 |
| 862 | 1403475 | 184 | 219 | 96 | 1.78104 |
| 863 | 1403450 | 146 | 128 | 174 | -2.27573 |
| 864 | 1403425 | 424 | 327 | 67 | 4.71363 |
| 865 | 1403400 | 199 | 89 | 244 | 2.0784 |
| 866 | 1403375 | 126 | 109 | 309 | 0 |
| 867 | 1403350 | 126 | 127 | 221 | 0 |
| 868 | 1403325 | 126 | 97 | 486 | 0 |
| 869 | 1403300 | 419 | 340 | 67 | -.470471 |
| 870 | 1403275 | 427 | 249 | 72 | .159979 |
| 871 | 1403250 | 157 | 99 | 264 | 4.47678 |
| 872 | 1403225 | 111 | 111 | 451 | 0 |
| 873 | 1403200 | 186 | 83 | 359 | .368266 |
| 874 | 1403175 | 126 | 106 | 353 | 0 |
| 875 | 1403150 | 136 | 94 | 457 | .34934 |
| 876 | 1403125 | 64 | 449 | 441 | 0 |
| 877 | 1403100 | 549 | 319 | 66 | -4.7673 |
| 878 | 1403075 | 127 | 259 | 119 | .729938 |
| 879 | 1403050 | 99 | 307 | 148 | 4.49159 |
| 880 | 1403025 | 177 | 518 | 80 | 1.8363 |
| 881 | 1403000 | 276 | 366 | 73 | 0 |
| 882 | 1402975 | 503 | 282 | 69 | -.771459 |
| 883 | 1402950 | 199 | 376 | 81 | 0 |

FIG. 30B

| | | | | | |
|---|---|---|---|---|---|
| 884 | 1402925 | 118 | 116 | 341 | -.545484 |
| 885 | 1402900 | 87 | 177 | 350 | -.832945 |
| 886 | 1402875 | 116 | 129 | 276 | 0 |
| 887 | 1402850 | 85 | 408 | 174 | -1.1159 |
| 888 | 1402825 | 78 | 517 | 193 | -1.73034 |
| 889 | 1402800 | 64 | 441 | 501 | 0 |
| 890 | 1402775 | 169 | 87 | 400 | -2.28978 |
| 891 | 1402750 | 181 | 93 | 276 | 0 |
| 892 | 1402725 | 207 | 175 | 107 | 3.79001 |
| 893 | 1402700 | 166 | 91 | 351 | 0 |
| 894 | 1402675 | 130 | 266 | 119 | -1.17754 |
| 895 | 1402650 | 317 | 424 | 70 | -.672226 |
| 896 | 1402625 | 126 | 229 | 133 | 0 |
| 897 | 1402600 | 138 | 98 | 427 | -.635917 |
| 898 | 1402575 | 163 | 321 | 95 | -.615642 |
| 899 | 1402550 | 352 | 313 | 73 | .405841 |
| 900 | 1402525 | 305 | 227 | 83 | -2.09453 |
| 901 | 1402500 | 187 | 93 | 276 | 0 |
| 902 | 1402475 | 164 | 97 | 303 | -.507862 |
| 903 | 1402450 | 69 | 390 | 385 | -.82697 |
| 904 | 1402425 | 276 | 271 | 81 | 0 |
| 905 | 1402400 | 124 | 533 | 103 | 4.91425 |
| 906 | 1402375 | 185 | 90 | 321 | 1.90828 |
| 907 | 1402350 | 128 | 104 | 457 | -.0670585 |
| 908 | 1402325 | 324 | 272 | 78 | -.693616 |
| 909 | 1402300 | 217 | 343 | 83 | -2.60834 |
| 910 | 1402275 | 197 | 507 | 80 | .842384 |
| 911 | 1402250 | 474 | 301 | 71 | 0 |
| 912 | 1402225 | 255 | 294 | 82 | .821143 |
| 913 | 1402200 | 133 | 126 | 246 | 0 |
| 914 | 1402175 | 387 | 268 | 76 | -1.45543 |
| 915 | 1402150 | 203 | 427 | 82 | .832112 |

FIG. 31A

| | | | | | |
|---|---|---|---|---|---|
| 916 | 1402125 | 114 | 119 | 438 | -2.44553 |
| 917 | 1402100 | 93 | 195 | 281 | -.200102 |
| 918 | 1402075 | 487 | 516 | 65 | .749131 |
| 919 | 1402050 | 74 | 451 | 274 | .278767 |
| 920 | 1402025 | 285 | 510 | 72 | -5.95315 |
| 921 | 1402000 | 93 | 203 | 271 | -2.98943 |
| 922 | 1401975 | 201 | 93 | 276 | 0 |
| 923 | 1401950 | 511 | 327 | 70 | 2.87658 |
| 924 | 1401925 | 79 | 492 | 217 | 1.01543 |
| 925 | 1401900 | 69 | 500 | 361 | -.982357 |
| 926 | 1401875 | 367 | 447 | 70 | .665881 |
| 927 | 1401850 | 126 | 529 | 106 | 0 |
| 928 | 1401825 | 150 | 105 | 327 | -.950176 |
| 929 | 1401800 | 86 | 326 | 221 | 0 |
| 930 | 1401775 | 138 | 111 | 338 | -.541489 |
| 931 | 1401750 | 216 | 89 | 301 | 0 |
| 932 | 1401725 | 73 | 544 | 277 | .518975 |
| 933 | 1401700 | 129 | 325 | 120 | -2.91783 |
| 934 | 1401675 | 139 | 515 | 100 | -.156644 |
| 935 | 1401650 | 88 | 205 | 348 | 2.82534 |
| 936 | 1401625 | 190 | 113 | 200 | .474785 |
| 937 | 1401600 | 276 | 438 | 76 | 0 |
| 938 | 1401575 | 120 | 349 | 127 | 2.18478 |
| 939 | 1401550 | 196 | 530 | 83 | .0591107 |
| 940 | 1401525 | 417 | 432 | 70 | 1.74596 |
| 941 | 1401500 | 299 | 302 | 81 | 1.39357 |
| 942 | 1401475 | 130 | 108 | 489 | -.0890753 |
| 943 | 1401450 | 380 | 550 | 69 | .0424064 |
| 944 | 1401425 | 164 | 98 | 376 | .527059 |
| 945 | 1401400 | 91 | 301 | 216 | 0 |
| 946 | 1401375 | 185 | 101 | 276 | 0 |
| 947 | 1401350 | 89 | 200 | 375 | 1.34362 |
| 948 | 1401325 | 545 | 538 | 66 | 1.26393 |
| 949 | 1401300 | 346 | 276 | 81 | 0 |

FIG. 31B

| | | | | | |
|---|---|---|---|---|---|
| 950 | 1401275 | 168 | 212 | 122 | -2.77343 |
| 951 | 1401250 | 177 | 266 | 106 | 0 |
| 952 | 1401225 | 126 | 157 | 221 | 0 |
| 953 | 1401200 | 93 | 226 | 276 | 0 |
| 954 | 1401175 | 200 | 94 | 318 | -.882094 |
| 955 | 1401150 | 134 | 302 | 125 | 1.16839 |
| 956 | 1401125 | 167 | 110 | 272 | 1.68248 |
| 957 | 1401100 | 218 | 517 | 82 | .573336 |
| 958 | 1401075 | 175 | 188 | 130 | 1.70343 |
| 959 | 1401050 | 165 | 102 | 353 | .754649 |
| 960 | 1401025 | 531 | 291 | 75 | 1.75843 |
| 961 | 1401000 | 87 | 389 | 218 | .828631 |
| 962 | 1400975 | 181 | 140 | 167 | -3.13003 |
| 963 | 1400950 | 153 | 129 | 230 | .628448 |
| 964 | 1400925 | 212 | 85 | 473 | -.191256 |
| 965 | 1400900 | 166 | 160 | 158 | 1.33531 |
| 966 | 1400875 | 102 | 211 | 248 | 2.14741 |
| 967 | 1400850 | 141 | 126 | 283 | 0 |
| 968 | 1400825 | 190 | 102 | 288 | -.369624 |
| 969 | 1400800 | 76 | 309 | 476 | 0 |
| 970 | 1400775 | 216 | 240 | 103 | -3.005 |
| 971 | 1400750 | 431 | 301 | 78 | 0 |
| 972 | 1400725 | 538 | 292 | 76 | 1.5465 |
| 973 | 1400700 | 276 | 406 | 81 | 0 |
| 974 | 1400675 | 154 | 116 | 301 | -2.3681 |
| 975 | 1400650 | 511 | 428 | 71 | 2.296 |
| 976 | 1400625 | 276 | 249 | 93 | 0 |
| 977 | 1400600 | 149 | 111 | 376 | 0 |
| 978 | 1400575 | 126 | 121 | 463 | 0 |
| 979 | 1400550 | 480 | 345 | 75 | -1.37779 |
| 980 | 1400525 | 151 | 126 | 265 | 0 |
| 981 | 1400500 | 76 | 527 | 310 | 2.05085 |

FIG.32

| | | | | | |
|---|---|---|---|---|---|
| 982 | 1400475 | 526 | 441 | 71 | 0 |
| 983 | 1400450 | 550 | 277 | 78 | .565681 |
| 984 | 1400425 | 85 | 266 | 368 | .428427 |
| 985 | 1400400 | 317 | 483 | 77 | -3.47279 |
| 986 | 1400375 | 88 | 550 | 199 | .290788 |
| 987 | 1400350 | 74 | 452 | 409 | .327562 |
| 988 | 1400325 | 388 | 324 | 80 | .0683539 |
| 989 | 1400300 | 201 | 266 | 106 | 0 |
| 990 | 1400275 | 170 | 167 | 159 | -.834737 |
| 991 | 1400250 | 456 | 307 | 79 | -1.38122 |
| 992 | 1400225 | 164 | 103 | 434 | -1.65994 |
| 993 | 1400200 | 295 | 289 | 89 | .295257 |
| 994 | 1400175 | 127 | 441 | 126 | 0 |
| 995 | 1400150 | 546 | 349 | 75 | -1.71003 |
| 996 | 1400125 | 487 | 276 | 81 | 0 |
| 997 | 1400100 | 118 | 370 | 146 | 1.35781 |
| 998 | 1400075 | 536 | 360 | 75 | -2.76159 |
| 999 | 1400050 | 165 | 115 | 309 | -1.14616 |
| 1000 | 1400025 | 496 | 415 | 74 | -.183825 |
| 1001 | 1400000 | 185 | 112 | 276 | 0 |

FIG. 33

| DESIRED FREQUENCY | N | $M_1$ | $M_2$ | $M_3$ | RESULTING FREQUENCY (Hz) | ERROR (Hz) |
|---|---|---|---|---|---|---|
| 1,425,000 KHz | 558 | 340 | 341 | 342 | 1,425,000,000.000 | 0.000 |
| 1,424,975 KHz | 563 | 213 | 231 | 304 | 1,424,975,000.203 | 0.203 |
| 1,424,950 KHz | 559 | 82 | 277 | 281 | 1,424,950,000.159 | 0.159 |
| 1,424,925 KHz | 566 | 349 | 464 | 510 | 1,424,924,999.894 | -0.106 |
| 1,418,900 KHz | 565 | 271 | 307 | 562 | 1,418,899,999.849 | -0.151 |
| ⋮ | ⋮ | ⋮ | ⋮ | ⋮ | ⋮ | ⋮ |
| 1,412,700 KHz | 561 | 361 | 441 | 554 | 1,412,700,000.000 | 0.000 |
| 1,412,675 KHz | 561 | 341 | 466 | 467 | 1,412,675,000.000 | 0.000 |
| 1,412,650 KHz | 557 | 110 | 308 | 505 | 1,412,650,000.166 | 0.166 |
| 1,412,625 KHz | 561 | 325 | 454 | 525 | 1,412,624,999.883 | -0.117 |
| 1,412,600 KHz | 556 | 111 | 230 | 368 | 1,412,599,999.784 | -0.216 |
| ⋮ | ⋮ | ⋮ | ⋮ | ⋮ | ⋮ | ⋮ |
| 1,400,100 KHz | 546 | 51 | 358 | 359 | 1,400,100,000.000 | 0.000 |
| 1,400,075 KHz | 554 | 184 | 304 | 481 | 1,400,075,000.150 | 0.150 |
| 1,400,050 KHz | 552 | 100 | 447 | 469 | 1,400,050,000.174 | 0.174 |
| 1,400,025 KHz | 554 | 142 | 526 | 550 | 1,400,024,999.831 | -0.169 |
| 1,400,000 KHz | 556 | 418 | 419 | 420 | 1,400,000,000.000 | 0.000 |

N : DIVISION RATIO OF VARIABLE DIVIDER $\Delta f$ : SMALLEST FREQUENCY INCREMENT (25KHz) OF OUTPUT FREQUENCY (fo)

$M_1$, $M_2$, $M_3$ : DIVISION RATIOS OF THREE-STAGE REMOVING CIRCUIT

FIG.36

| DESIRED FREQUENCY | N | $M_1$ | $M_2$ | $M_3$ | RESULTING FREQUENCY (Hz) | ERROR (Hz) |
|---|---|---|---|---|---|---|
| 1,425,000 KHz | 138 | 93 | 94 | 95 | 1,425,000,000.000 | 0.000 |
| 1,424,975 KHz | 138 | 71 | 108 | 117 | 1,424,975,001.151 | 1.151 |
| 1,424,950 KHz | 138 | 86 | 94 | 104 | 1,424,950,019.344 | 19.344 |
| 1,424,925 KHz | 139 | 104 | 131 | 134 | 1,424,925,031.024 | 31.024 |
| 1,418,900 KHz | 131 | 32 | 34 | 45 | 1,418,900,026.660 | 26.660 |
| ⋮ | ⋮ | ⋮ | ⋮ | ⋮ | ⋮ | ⋮ |
| 1,417,725 KHz | 133 | 29 | 60 | 84 | 1,417,725,137.839 | 137.839 |
| 1,415,775 KHz | 136 | 48 | 105 | 105 | 1,415,774,896.135 | -103.865 |
| 1,412,650 KHz | 137 | 79 | 106 | 119 | 1,412,650,007.243 | 7.243 |
| 1,412,625 KHz | 138 | 119 | 133 | 136 | 1,412,625,007.133 | 7.133 |
| 1,412,600 KHz | 136 | 62 | 85 | 102 | 1,412,599,995.363 | -4.637 |
| ⋮ | ⋮ | ⋮ | ⋮ | ⋮ | ⋮ | ⋮ |
| 1,400,100 KHz | 135 | 60 | 95 | 111 | 1,400,099,990.165 | -9.835 |
| 1,400,075 KHz | 135 | 79 | 83 | 87 | 1,400,074,992.364 | -7.636 |
| 1,400,050 KHz | 133 | 42 | 72 | 76 | 1,400,050,017.176 | 17.176 |
| 1,400,025 KHz | 134 | 49 | 67 | 123 | 1,400,024,993.790 | -6.210 |
| 1,400,000 KHz | 136 | 103 | 104 | 105 | 1,400,000,000.000 | 0.000 |

N : DIVISION RATIO OF DIVIDER $\Delta f$ : SMALLEST FREQUENCY INCREMENT (25KHz) OF OUTPUT FREQUENCY (fo)

$M_1$, $M_2$, $M_3$ : DIVISION RATIOS OF THREE-STAGE REMOVING CIRCUIT

K = 10 : DIVISION RATIO OF DIVIDER

FIG. 37

| DESIRED FREQUENCY | N | $M_1$ | $M_2$ | $M_3$ | RESULTING FREQUENCY (Hz) | ERROR (Hz) |
|---|---|---|---|---|---|---|
| 1,425,000 KHz | 175 | 19 | 55 | 55 | 1,425,000,000.000 | 0.000 |
| 1,424,975 KHz | 177 | 55 | 88 | 157 | 1,424,975,009.734 | 9.734 |
| 1,424,950 KHz | 177 | 12 | 28 | 154 | 1,424,949,999.028 | -0.972 |
| 1,424,925 KHz | 177 | 67 | 95 | 158 | 1,424,924,997.824 | -2.176 |
| 1,418,900 KHz | 177 | 104 | 144 | 159 | 1,418,900,000.042 | 0.042 |
| ⋮ | ⋮ | ⋮ | ⋮ | ⋮ | ⋮ | ⋮ |
| 1,401,825 KHz | 174 | 43 | 83 | 141 | 1,401,825,023.714 | 23.714 |
| 1,409,875 KHz | 175 | 52 | 79 | 141 | 1,409,874,976.311 | -23.689 |
| 1,412,650 KHz | 176 | 47 | 62 | 299 | 1,412,650,000.346 | 0.346 |
| 1,412,625 KHz | 176 | 174 | 212 | 304 | 1,412,624,999.899 | -0.101 |
| 1,412,600 KHz | 176 | 186 | 281 | 306 | 1,412,599,999.937 | -0.063 |
| ⋮ | ⋮ | ⋮ | ⋮ | ⋮ | ⋮ | ⋮ |
| 1,400,100 KHz | 174 | 10 | 84 | 171 | 1,400,099,993.698 | -6.302 |
| 1,400,075 KHz | 174 | 42 | 71 | 171 | 1,400,075,000.838 | 0.838 |
| 1,400,050 KHz | 174 | 56 | 89 | 172 | 1,400,050,000.059 | 0.059 |
| 1,400,025 KHz | 174 | 45 | 117 | 173 | 1,400,024,999.338 | -0.663 |
| 1,400,000 KHz | 172 | 25 | 42 | 57 | 1,400,000,000.000 | 0.000 |

N : DIVISION RATIO OF DIVIDER $\Delta f$ : SMALLEST FREQUENCY INCREMENT (25KHz) OF OUTPUT FREQUENCY (fo)

$M_1$, $M_2$, $M_3$ : DIVISION RATIOS OF THREE-STAGE REMOVING CIRCUIT

K = 8 : DIVISION RATIO OF DIVIDER 5,578,968

1

FREQUENCY CONVERTER, MULTISTAGE FREQUENCY CONVERTER AND FREQUENCY SYNTHESIZER UTILIZING THEM

This is a Continuation of application Ser. No. 08/075,513 filed as PCT/JP92/01349 Oct. 16, 1992 published as WO93/08645 Apr. 29, 1993, now abandoned.

TECHNICAL FIELD

The present invention relates to a frequency converter, a multistage frequency converter and a frequency synthesizer using these converters, all of which are used in the field of communication requiring a frequency synthesization, e.g. in the field of digital phase-locked system and the like.

BACKGROUND ART fast frequency conversion is required in a frequency hopping system which is one of the spectrum diffusion communications, mobile radio data communication and the like. Typical methods of synthesizing frequencies can be classified into three systems: 1) a direct synthesization for synthesizing many sources of frequency, 2) an indirect synthesization using a reference frequency corresponding to the smallest frequency increment and a phase-locked system and a digital synthesization for increasing the speed of the indirect synthesization.

The indirect synthesization is broadly used in many fields of communication since the phase locked loop (PLL) frequency synthesizer constructed thereby can be reduced in size and cost and have a spurious component smaller than that of the direct synthesization.

However, the indirect synthesization is disadvantageous in that since frequencies to be compared in phase are lower, the time constant in a low-pass filter must be increased to prolong the aquisition time when one frequency is to be switched to another frequency. If the frequencies to be compared in phase are increased to increase the acquisition time, the number of channels must be undesirably decreased.

FIG. 38 illustrates the basic arrangement of a prior art frequency synthesizer constructed in accordance with the indirect synthesization. The frequency synthesizer comprises a reference divider 100, a divider 102, a phase detector 104, a voltage controlled oscillator (VCO) 106, a low-pass filter (LPF) 108 and a charge pump 110.

The phase detector 104 compares the phase of a reference frequency fr generated at the base divider 100 with that of a feedback frequency fb obtained by dividing a VCO output frequency fo with the division ratio N of the divider 102. The output signal of the phase detector 104 is fed into the voltage control led oscillator 106 through the charge pump 110 and the low-pass filter 108 so that the output frequency fo of the voltage controlled oscillator 106 will be a predetermined level. The relationship between the output frequency fo, the reference frequency fr and the division ratio N is represented by:

$$fo = N \cdot fr \qquad (1).$$

It is understood from the equation (1) that since the reference frequency fr is constant, the output frequency fo varies depending on the division ratio N (N=any integer). Thus, the smallest frequency interval Δf representing the spacing output frequencies fo becomes equal to the reference frequency fr. Since the division ratio N and reference frequency fr are interdependent, the division ratio N is automatically determined if the desired output frequency fo and reference frequency fr (=Δf) have been determined.

In such a frequency synthesizer, if the reference frequency fr is 25 kHz and then it is desired to obtain an output frequency fo equal to 1.400 GHz, the division ratio N becomes equal to 56000. As the output frequency fo is switched from 1.400 GHz to 1.4126 GHz, the division ratio N must be switched from 56000 to 56504.

In the prior art frequency synthesizer wherein the necessary frequency interval Δf is set to be equal to the reference frequency fr, the reference frequency fr must be reduced if the frequency interval Δf is small. This raises a problem in that the acquisition time cannot be decreased.

In this connection, the reference frequency fr in the prior art frequency synthesizer has two functions to determine the smallest frequency interval Δf in the output frequency and also to compare the phase off the reference frequency fr with that of the feedback frequency fb so as to generate a given output frequency fo. If the two functions of the reference frequency fr are separated so that the smallest frequency interval Δf of the output frequency can be controlled by a second circuit, the reference frequency fr needs only to oscillate at given frequency fo independently of changes in the smallest frequency interval Δf. Thus, the frequencies fr and fb can be increased to shorten the acquisition time. Therefore, the prior art frequency synthesizer can determine the smallest frequency interval Δf of the output frequency between the divider 102 and the voltage control led oscillator 106. When the integer divider is replaced by a non-integer divider and if the non-integer division ratio can be continuously and arbitrarily switched responsive to the desired output frequency fo, the acquisition time can be reduced even if the frequency spacing is smaller. However, the conventional non-integer divider could not meet such requirements and could not be used in the frequency synthesizers.

Some of the prior art non-integer dividers are disclosed in Japanese Patent Laid-Open Nos. Hei 3-206721, Hei 3-131120, Hei 2-305022, Hei 2-271717, Hei 2-224558, Hei 1-238220, Hei 1-120910, Hei 2-101663, Hei 2-44557, Sho 60-500593, She 63-290409, Sho 60-172808 and Sho 60-172807, Japanese Utility Model Laid-Open No. Sho 55-121539, Japanese Patent Publication No. Sho 51-416, and Japanese Patent Laid-Open Nos. Sho 50-115460 and Sho 59-3555, for example.

In view of the problems in the prior art, it is an object of the present invention to provide a frequency synthesizer which can reduce the acquisition time.

Another object of the present invention is to provide a frequency converter and a multistage frequency converter which can be applied to the frequency synthesizer or the like by enabling the non-integer division ratio to be finely set.

SUMMARY OF THE INVENTION

The present invention provides a frequency converter which comprises:

a divider responsive to a pulse train having a predetermined frequency for performing a dividing operation with its variable integer division ratio; and a cycle swallower for receiving the output of the divider as a control input to remove pulses from the pulse train at predetermined intervals, thereby providing an output signal having a frequency corresponding to a level non-integer times higher than the frequency of the input signal.

The frequency converter can remove pulses from the input pulse train at predetermined intervals to provide any frequency between input and output signals by dividing a signal from the input pulse train to form a control signal and yet providing a variable integer division ratio.

The present invention also provides a multistage frequency converter which can be connected in series and/or parallel to the frequency converters of the present invention. Each of the frequency converters defining the multistage frequency converter can have any converted frequency. Therefore, the multistage frequency converter can have a finely set division ratio which is a non-integer as a whole.

In one aspect of the present invention, the multistage frequency converter comprises a plurality of frequency converters which are connected in series to each other, each of said frequency converters comprising:

a divider responsive to a pulse train having a predetermined frequency for performing a dividing operation with its variable integer division ratio; and a cycle swallower for receiving the output of the divider as a control input to remove pulses from the pulse train at predetermined intervals.

In another aspect of the present invention, the multistage frequency converter comprises a plurality of frequency converters, each of said frequency converters comprising:

a divider responsive to a pulse train having a predetermined frequency for performing a dividing operation with its variable integer division ratio; and a cycle swallower for receiving the output of the divider as a control input to remove pulses from the pulse train at predetermined intervals, the output of one of said frequency converters being used as an input to the divider of the other.

In still another aspect of the present invention, the multistage frequency converter comprises a plurality of frequency convertors, each of said frequency convertors comprising:

a divider responsive to a pulse train having a predetermined frequency for performing a dividing operation with its variable integer division ratio; and a cycle swallower for receiving the output of the divider as a control input to remove pulses from the pulse train at predetermined intervals, the output of one of said frequency converters being used as an input to the divider of the other, two or more of said frequency converters being connected in series to each other.

The present invention further provides a frequency synthesizer which comprises:

a phase detector for comparing a reference frequency with a feedback frequency;

a filter connected to the phase detector for permitting the passage of a low frequency therethrough;

a voltage control led oscillator connected to the filter;

a frequency converter for receiving an oscillation signal from the voltage controlled oscillater, the frequency converter comprising a first divider responsive to a pulse train having a predetermined frequency for performing a dividing operation with an integer division ratio and a cycle swallower for receiving the division output of the first divider as a control input to remove pulses from the pulse train at predetermined intervals; and a second divider for dividing the output of the frequency converter to form the feedback frequency, whereby the reference and feedback frequencies can be controlled to be equal to each other.

In a further aspect of the present invention, the frequency synthesizer comprises:

a phase detector for comparing a reference frequency with a feedback frequency;

a filter connected to the phase detector for permitting the passage of a low frequency therethrough;

a voltage controlled oscillator connected to the filter;

a multistage frequency converter for receiving an oscillation signal from the voltage controlled oscillator as an input; and a first divider for dividing the output of the multistage frequency converter to form the feedback frequency, whereby the reference and feedback frequencies can be controlled to be equal to each other.

Each of the aforementioned frequency synthesizers comprises a plurality of frequency converters or multistage frequency converters, each of which is constructed in accordance with the present invention. These multistage frequency converters can provide a division output having a substantially constant frequency irrespectively of the frequency in the output signal of the voltage controlled oscillater since the non-integer division ratio can be finely set. The division output is formed into a feedback frequency by the first divider and then inputted into the phase detector. Thus, the feedback frequency can be set to be higher, irrespectively of the output frequency of the voltage control led oscillator. This means that the reference frequency to be compared with the feedback frequency can be also increased. In such a manner, the acquisition time can be greatly reduced.

In a further aspect of the present invention, the frequency synthesizer comprises:

a phase detector for comparing a reference frequency with a feedback frequency;

a filter connected to the phase detector for permitting the passage era low frequency therethrough;

a voltage control led oscillator connected to the filter;

a first divider for dividing the oscillation signal from said voltage controlled oscillator;

a frequency converter comprising a second divider responsive to a pulse train having a predetermined frequency for performing a dividing operation with its variable integer division ratio and a cycle swallower for receiving the output of the divider as a control input to remove pulses from the pulse train at predetermined intervals, said frequency converter receiving the division signal from said first divider as an input; and a third divider for dividing the output of said frequency converter to form said feedback frequency, said reference and feedback frequencies being controlled to be equal to each other.

In a further aspect of the present invention, the frequency synthesizer comprises:

a phase detector for comparing a reference frequency with a feedback frequency;

a filter connected to the phase detector for permitting the passage of a low frequency therethrough;

a voltage controlled oscillator connected to the filter;

a first divider for dividing an oscillation signal from said voltage controlled oscillator;

a multistage frequency converter for receiving the division signal from said first divider as an input; and a second divider for dividing the output of said multistage frequency converter to form said feedback frequency, said reference and feedback frequencies being controlled to be equal to each other.

Each of these frequency synthesizers may include a fixed or variable divider which is inserted between the voltage controlled oscillater and the frequency converter or between the voltage controlled oscillater and the multistage frequency converter. Therefore, the signal to be inputted into the frequency converter or the multistage frequency converter can be reduced in frequency. Thus, the power consumption can be reduced.

BRIEF DESCRIPTION OF THE DRAWINGS

FIGS. 17 to 32 illustrate combinations of various division ratios in the frequency converters in the first embodiment of the present invention and their output frequencies.

FIG. 33 illustrates various division ratios and output frequencies of the frequency converters in the first embodiment of the frequency synthesizer according to the present invention when a divider having a variable division ratio is used.

FIGS. 36 and 37 illustrate the division ratio and output frequency of each of the frequency converters in the multistage frequency converter of the frequency synthesizer of the second embodiment when a divider having a variable division ratio is used.

BEST MODE FOR CARRYING OUT THE INVENTION

The present invention will now be described by way of example with reference to the drawings. In this connection, see International Conference on Communications, Jun. 14–18, 1992, pp. 496–500, which had been published by the inventors.

First Embodiment

Figure 1:
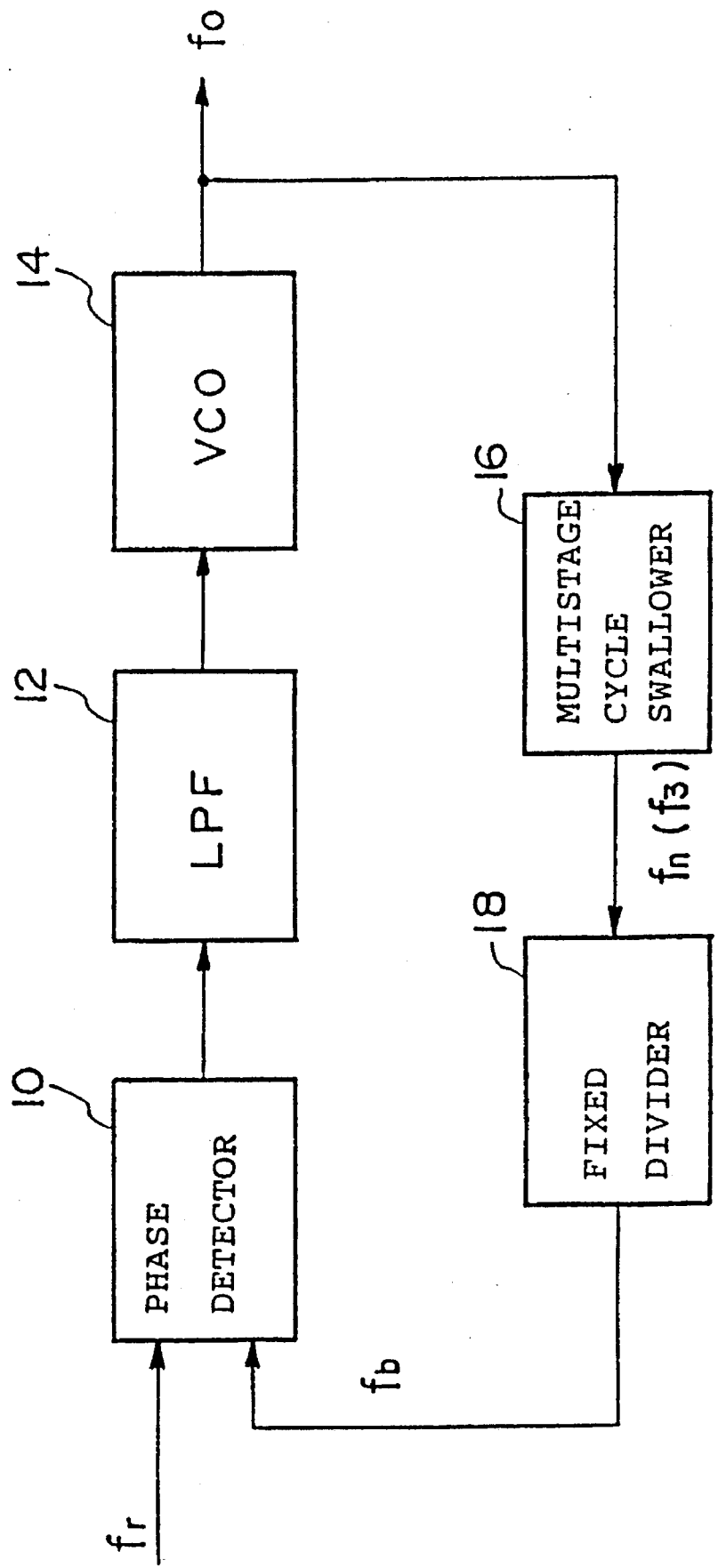
FIG. 1 is a block diagram showing the basic arrangement of the first embodiment of a frequency synthesizer constructed in accordance with the present invention.

FIG. 1 is a block diagram for illustrating the basic arrangement of the first embodiment of a frequency synthesizer constructed in accordance with the present invention. The frequency synthesizer comprises a phase detector 10, a low-pass filter (LPF) 12, a voltage controlled oscillator (VCO) 14, a multistage frequency converter 16 and a fixed divider 18. In the frequency synthesizer of the first embodiment, the multistage frequency converter controlled by a new manner can be used to set a reference frequency fr and the smallest frequency interval Δf independently. The reference frequency fr as well as a feedback frequency fb can be increased by using the same smallest frequency increment as that of the prior art frequency synthesizer and by decreasing the division ratio N in the fixed divider 18. At the same time, the loop gain can be increased.

In FIG. 1, the multistage frequency converter 16 comprises a plurality of non-integer frequency dividers connected to each other, each of which has a variable division ratio. The entire division ratio of the multistage frequency converter 16 can be thus set arbitrarily and finely. Therefore, the multistage frequency converter 16 can operate so that the input frequency fn of the fixed divider 18 becomes constant irrespectively of changes in the output frequency fo of the voltage controlled oscillator 14. If the input frequency fn of the fixed divider 18 is constant, the feedback frequency fb from the fixed divider 18 also becomes constant. As a result, the reference frequency fr to be compared with the feedback frequency fb can be made constant. Consequently, the smallest frequency interval Δf representing the spacing in the output frequencies fo of the voltage controlled oscillator 14 can be set independently of the reference frequency fr which can be thus increased. Since the reference frequency fr is generally inversely proportional to the acquisition time, the acquisition time can be reduced by setting the reference frequency fr higher.

Figure 2:
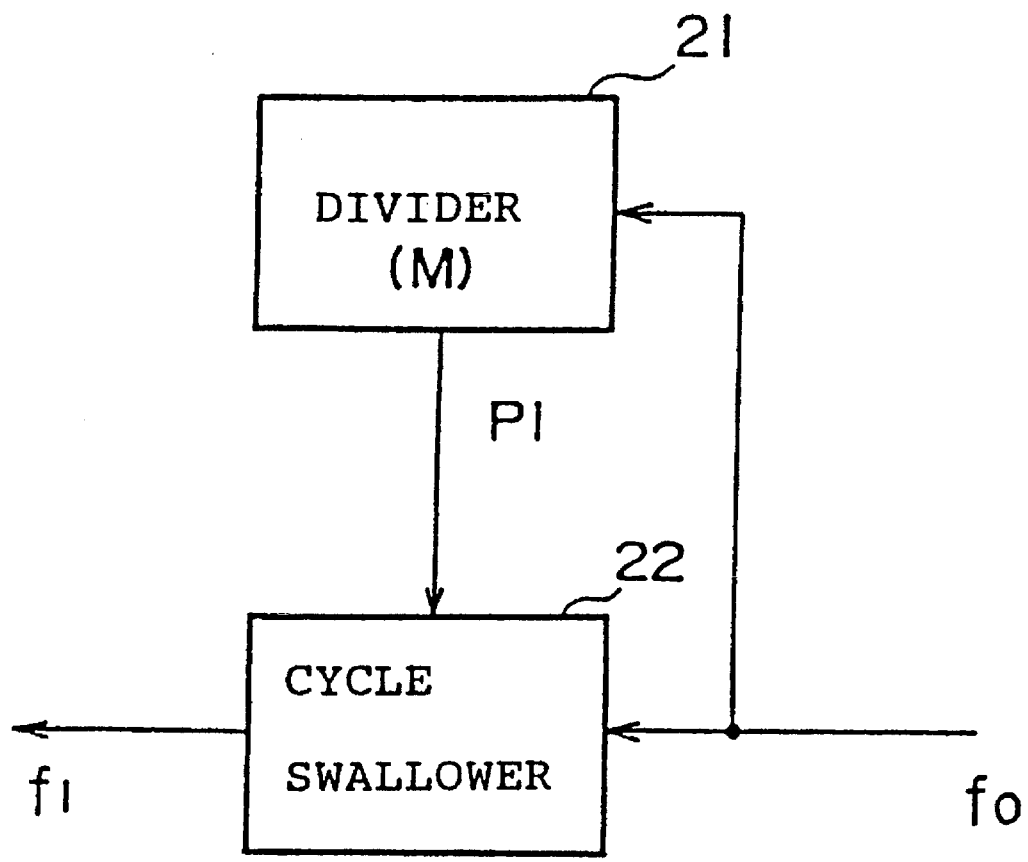
FIG. 2 is a block diagram showing a frequency converter which defines a multistage frequency converter used in the frequency synthesizer of the first embodiment.

FIG. 2 is a block diagram of one of the frequency converters which define the multistage frequency converter 16. The frequency converter comprises a divider 21 and a cycle swallower 22. The divider 21 functions to perform a dividing operation with a division ratio M (M is an integer) such that an input pulse train having a frequency fo is divided to output a pulse train having a cycle multiplied by M. The outputted pulse train is then inputted into the cycle swallower 22 which in turn removes pulses from the received pulse train at a given timing. More particularly, if the pulse train having its frequency fo is received by the cycle swallower 22, the latter removes pulses from the pulse train at such a timing that a pulse train Pi is outputted from the divider 21.

Figure 3:
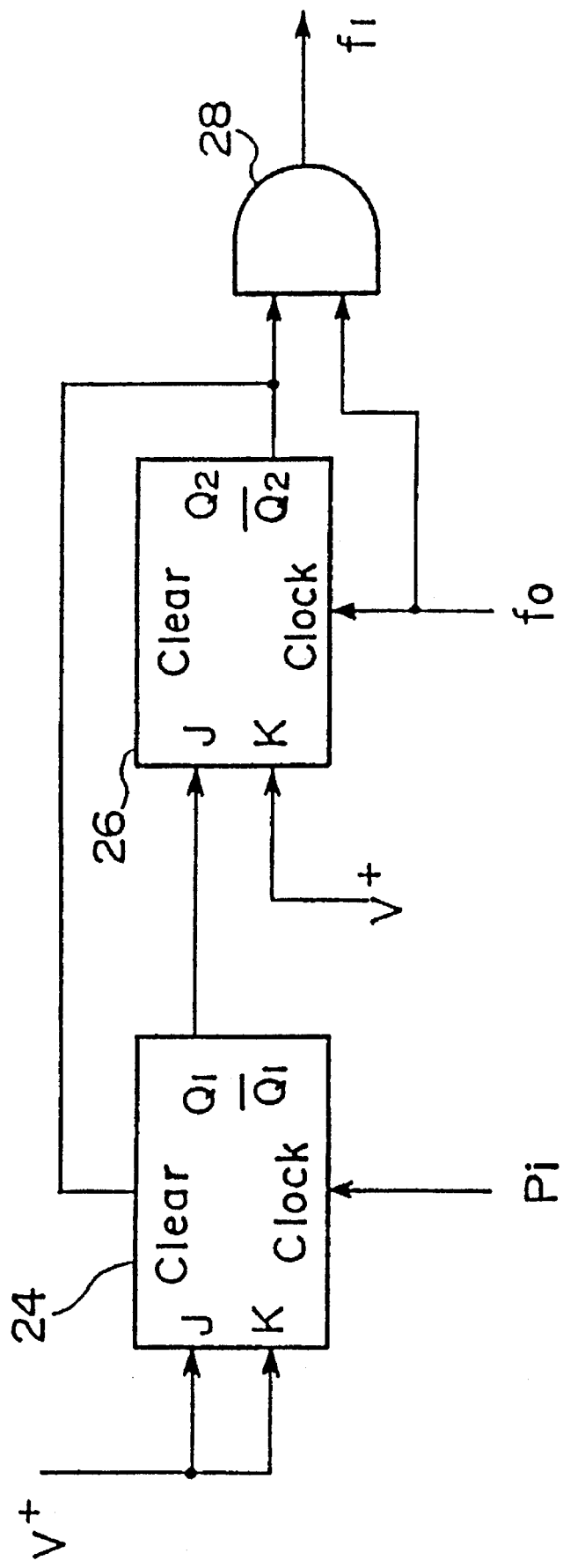
FIG. 3 is a view showing the details of a cycle swallower in the frequency converter.

FIG. 3 shows the detailed structure of the cycle swallower 22 which may be conventional, for example, as disclosed in Kings-ford-Smith, U.S. Pat. No. 8,928,818. The cycle swallower 22 comprises two J-K flip flops 24, 26 and an AND gate 28. Since the cycle swallower may be conventional as described, it may be replaced by any suitable means other than that of FIG. 3 if the same operation can be accomplished.

Figure 4:
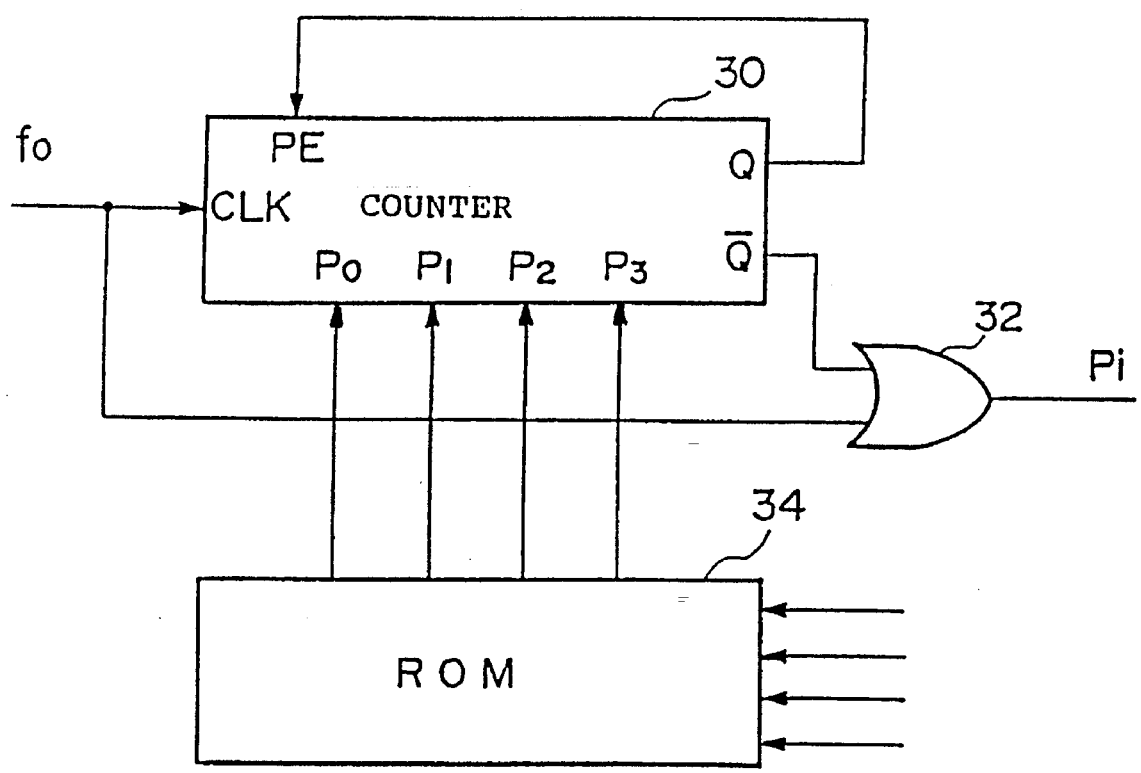
FIG. 4 is a view showing the details of a divider in the frequency converter.

FIG. 4 shows the detailed structure of the divider 21 which may be conventional and comprises a programmable counter 30, an OR gate 32 and a read only memory (ROM) 34. Data read out from the ROM 84 is applied to the programmable counter 80 as an initial count. When data from the ROM 34 is changed, therefore, the initial count at the programmable counter 30 is also changed to vary the entire division ratio in the divider 21.

Figure 5:
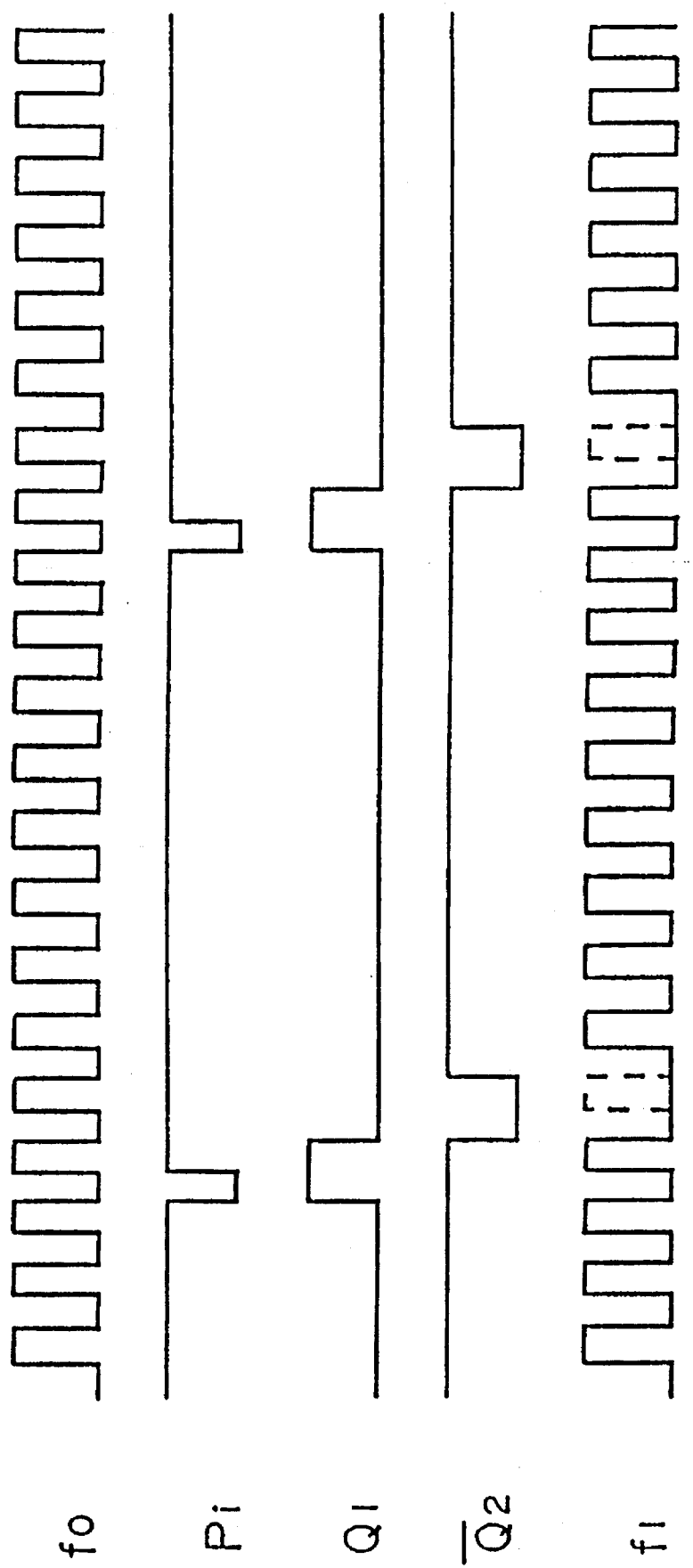
FIG. 5 is a timing chart for illustrating detailed operations of various parts in the frequency converter.

FIG. 5 is a timing chart illustrating the detailed operations of various parts in the arrangements shown in FIGS. 2, 3 and 4. As shown in FIG. 5, each pulse is removed by the cycle swallower 22 at a timing next to one pulse Pi outputted from the divider 21. When pulses are removed at such a timing and, for example, if the division ratio in the divider 21 is assumed to be M (integer), the divider 21 will function as a non-integer divider having its division ratio (1-1/M). By changing the value M, therefore, the entire division ratio (1-1/M) can be set arbitrarily and finely.

Figure 6:
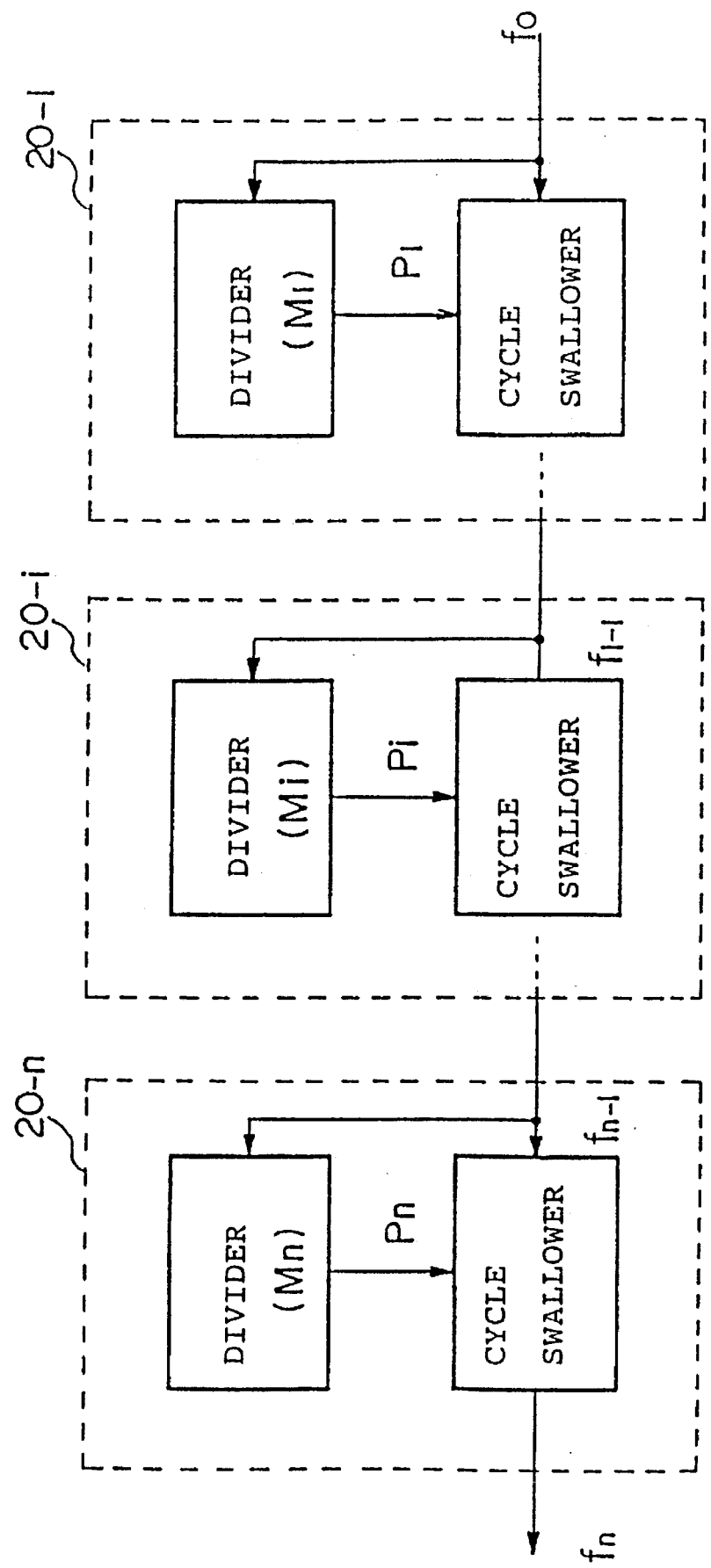
FIG. 6 is a view showing the arrangement of a multistage frequency converter which comprises a plurality of FIG. 2 frequency converters connected in series to each other.

FIG. 6 shows the arrangement of a multistage frequency converter which comprises a plurality of such frequency converters as shown in FIG. 2, these frequency converters being connected in series to each other. Each of the frequency converters 20-1, . . . 20-i, . . . 20-n corresponds to that of FIG. 2. The division ratio Mi of each of the frequency converters can be independently set at any value.

First-stage frequency converter 20-1 removes inputted pulses of the frequency fo at a time interval MI. First-stage output frequency f1 is:

$$f1 = fo(1 - 1/M1) \quad (2)$$

The other frequency converters (20-i and others) similarly remove pulses. Thus, n-stage frequency converter 20-n will have an out put frequency fn:

$$fn = fo(1 - 1/M1) \ldots (1 - 1/Mi) \ldots (1 - 1/Mn) \quad (3)$$

Figure 7:
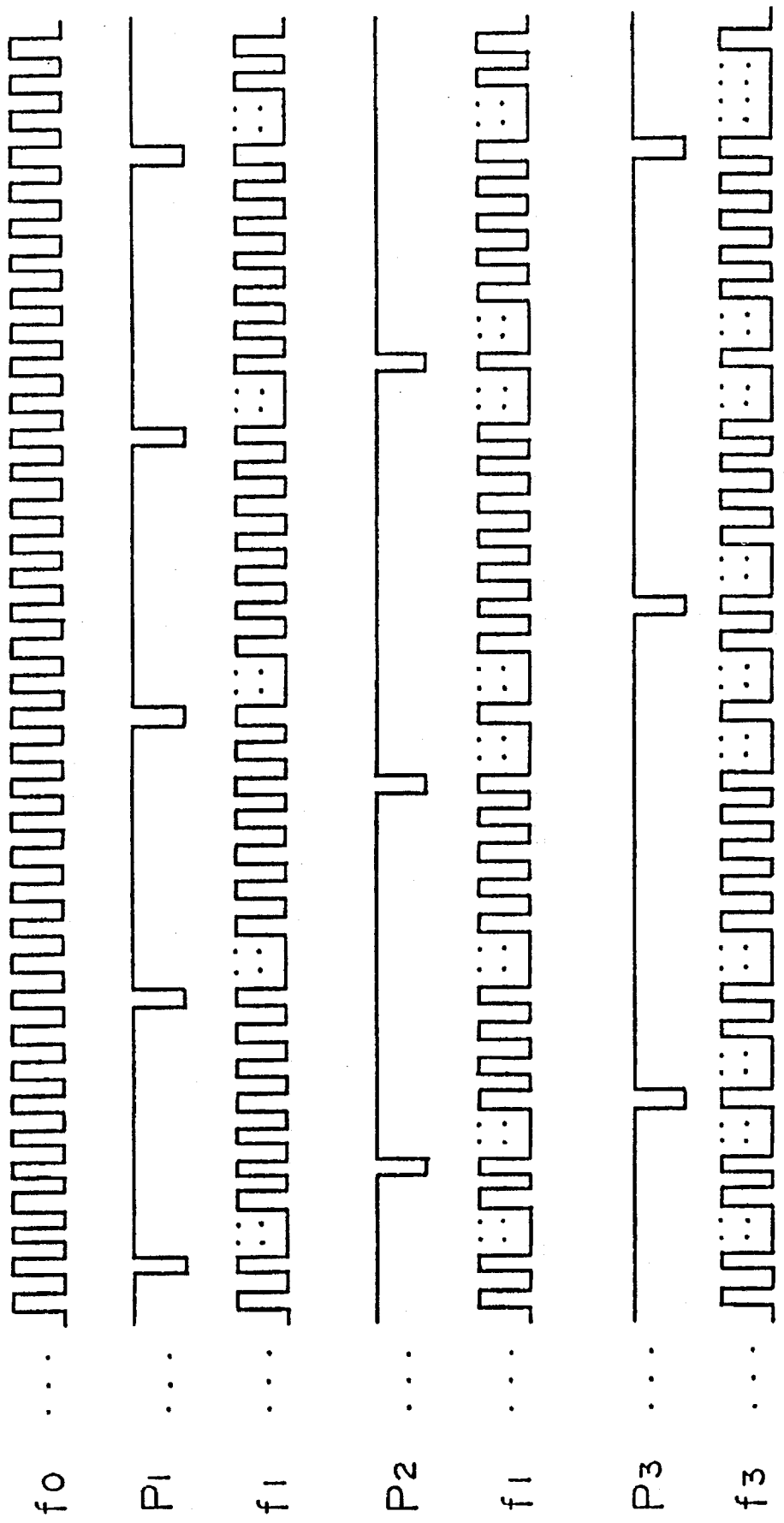
FIG. 7 illustrates output waveforms at various parts of a multistage (three-stage) frequency converter in which three frequency converters are connected in series to each other.

FIG. 7 shows waveforms at various parts of a multistage (three-stage) frequency converter comprising three frequency converters which are connected in series to each other. In such a case, the equation (3) is rewritten by:

$$f3 = fo(1 - 1/M1)(1 - 1/M2)(1 - 1/M3) \quad (4)$$

If it is now assumed that the multistage frequency converter 16 comprises three frequency converters connected in series to each other, the relationship between input and output frequencies meets the equation (4).

Figure 8:
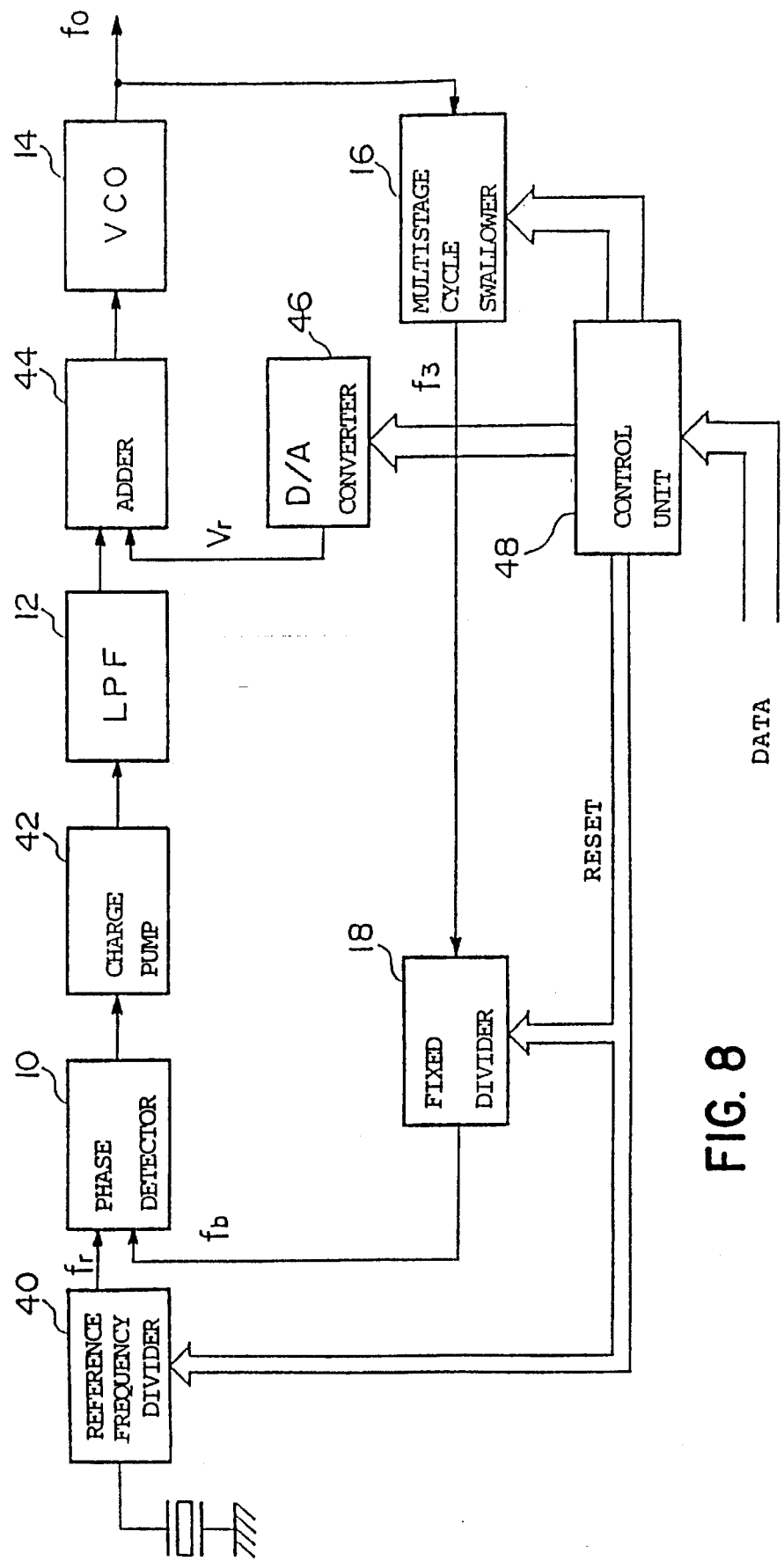
FIG. 8 is a view showing the entire arrangement of the frequency synthesizer which is the first embodiment of the present invention and includes a controller.

FIG. 8 shows the entire arrangement of the frequency synthesizer of the present embodiment which includes a controller. The frequency synthesizer of FIG. 8 comprises a reference divider 40, a charge pump 42, an adder 44, a D/A converter 46 and a controller 48 in addition to the components of the frequency synthesizer shown in FIG. 1.

The reference divider 40 produces a reference frequency fr. The charge pump 42 is connected between the phase detector 10 and the low-pass filter 12, with the output signal having three states; charge, discharge and open. On synchronization of frequency, the output of the charge pump 42 is in the open state. If the frequencies are greatly different from each other, the output of the charge pump 42 becomes only the charge or discharge state. The adder 44 functions to provide a given bias voltage to the voltage controlled oscillator 14. This bias voltage Vr may be produced by converting data from the controller 48 into a voltage by the use of the D/A converter 46. The controller 48 functions to control the switching of output frequency fo at the voltage controlled oscillator 14.

On switching the output frequency fo, the controller 48 feeds data to the D/A converter 46 which in turn outputs a given bias voltage Vr to control the input voltage at the voltage controlled oscillator 14 into a given level. The controller also outputs a reset signal which is used to initialize the fixed and reference dividers 18, 40. The controller 48 further functions to provide an instruction to the multistage frequency converter 16 so that the entire division ratio in the multistage frequency converter 16 will be set at a predetermined level. More particularly, the division ratio at each of the three frequency converters in the multistage frequency converter 16 is changed to change the entire division ratio of the multistage frequency converter 16, by changing data from the ROM 34 in the divider 21. Since the changing of frequency is carried out by changing each of the values M1, M2 and M3 in the equation (4), the entire division ratio (i-1/M1)·(1-1/M2). (1-1/M3) of the multistage frequency converter 16 can be finely set to provide substantially any output frequency f3.

As seen from the equation (4), the output frequency f3 can be made constant by suitably setting the division ratio (Mi) in each stage of the multistage frequency converter to remove any increment or decrement in the output frequency fo of the voltage controlled oscillator 14. Therefore, the division ratio N of the fixed divider 18 can be freely set irrespectively of changes in the output frequency fo. If the division ratio N is set to be smaller than the levels in the prior art, the feedback frequency fb can be set at a level much higher than those of the prior art loops.

In the frequency synthesizer shown in FIG. 8, it is now assumed that the reference frequency fr or the smallest frequency interval Δf is equal to 25 kHz and that the output frequency fo is to be changed from 1.400 GHz to 1.4126 GHz. If such a change of output frequency fo is made by the use or the prior art frequency synthesizer, the division ratio N of the divider must be changed from 56000 to 56504. In accordance with the frequency synthesizer of the present embodiment, however, all the aforementioned output frequencies fo can be provided by fixing the division ratio N of the fixed divider 18 to 550 and by setting both the feedback and reference frequencies fb, fr at 2.5 MHz while changing the division ratios M1, M2 and M3 of the respective dividers in the multistage (three-stage) frequency converter 16 from 185, 112 and 276 to 55, 294 and 192, respectively.

FIGS. 17 to 32 illustrate various combinations of the division ratios M1, M2 and M3 of the dividers in the multistage frequency converter 16 when it is set such that the reference frequency fr is equal to 2.5 MHz, the division ratio N of the fixed divider 18 is 550 and the output frequency f3 of the multi-stage frequency converter 16 is 1.375 GHz. As seen from these figures, the division ratios H1, H2 and H3 can be selected such that the output frequency fo will be provided at every 25 kHz interval between 1.400 GHz and 1.425 GHz. The resulting 1001 output frequencies fo are provided within the error range of ±28 Hz.

If the division ratios M1, M2 and M3 corresponding to 1001 frequencies which are provided at every 25 kHz interval between 1.400 GHz and 1.425 GHz are previously stored in the ROM 34 shown in FIG. 4, the 1001 output frequencies fo can be switched from one to another by changing the division ratios M1, M2 and M3.

Although the frequency synthesizers shown in FIGS. 1 and 8 have been described as to the output frequency f3 of the multi-stage frequency converter 16 being divided by the fixed divider 18 with the division ratio N, the fixed divider 18 may be replaced by any other variable divider which can change the division ratio N. If such a variable divider is used, the division ratio N' thereof may be combined with the division ratios M1, M2 and M3 of the respective dividers in the multistage frequency fo converter 16 such that the feedback frequency fb can be made substantially constant, irrespectively of the output frequency of the voltage controlled oscillator 14.

If the frequency synthesizer is set such that the smallest frequency interval Δf of the output frequency fo of the voltage controlled oscillator 14 is equal to 25 kHz, the reference frequeney fr is equal to 2.5 MHz and the output frequency fo is changed from 1.400 GHz to 1.425 GHz, as described, the frequency error can be maintained within ±0.5 Hz.

FIG. 33 shows an example that the division ratios M1, M2 and M3 of the respective dividers of the multistage frequency converter 16 are combined with the division ratio N' of the variable divider in the above-mentioned manner.

Although the multistage frequency converter 16 has been described as to three frequency converters connected in series to each other as shown in FIG. 2, the connection between the frequency converters may be varied in accordance with the present invention.

Figure 34:
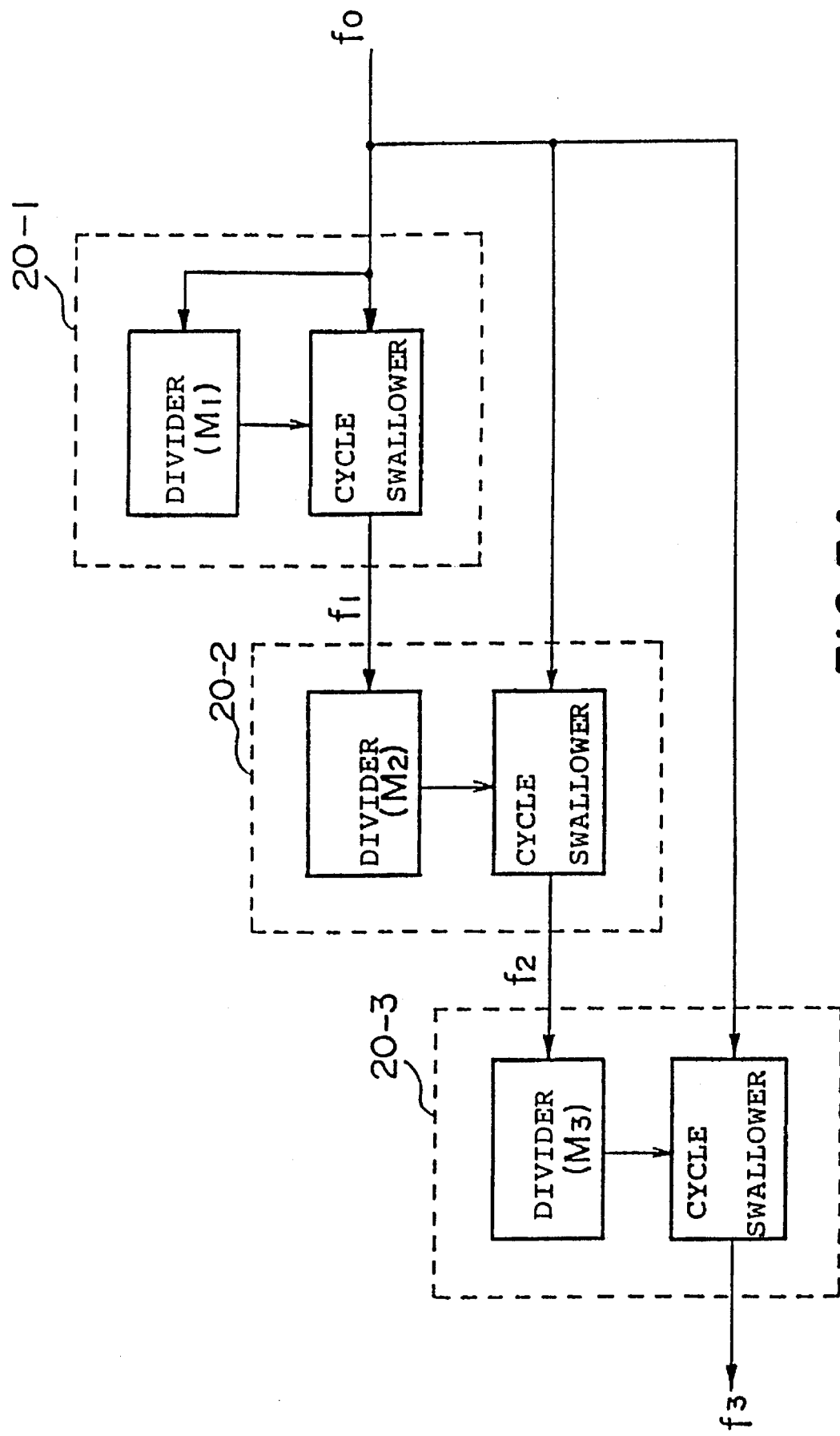
FIG. 34 is a view showing the arrangement of a multistage frequency converter in which a plurality of frequency converters are connected parallel to each other.

FIG. 34 shows another arrangement in which the output of first-stage frequency converter 20-1 is applied to the divider of second-stage frequency converter 20-2. Similarly, the output of second-stage frequency converter 20-2 is inputted to the divider or third-stage frequency converter 20-3. In such a manner, the multistage frequency converter 16 may be constructed even by using the output of any upstream-stage frequency converter as an input to the divider of the downstream-stage frequency converter. In such a case, the relationship between the input frequency fo and the output frequency f3 in the multistage frequency converter 16 is represented by:

$$fc = fo(1-(1-1/M1)/M2)/M3) \quad (5)$$

When the frequency converters are connected parallel to each other as described, any adjacent pulse can be prevented from being removed by each or the frequency converters in the multi-stage frequency converter 16. Thus, the phase jitter in the output frequency fc can be reduced. Although FIG. 34 illustrates three frequency converters connected parallel to each other, the number or frequency converters may be increased with any combination of parallel and series connections.

Second Embodiment

Figure 35:
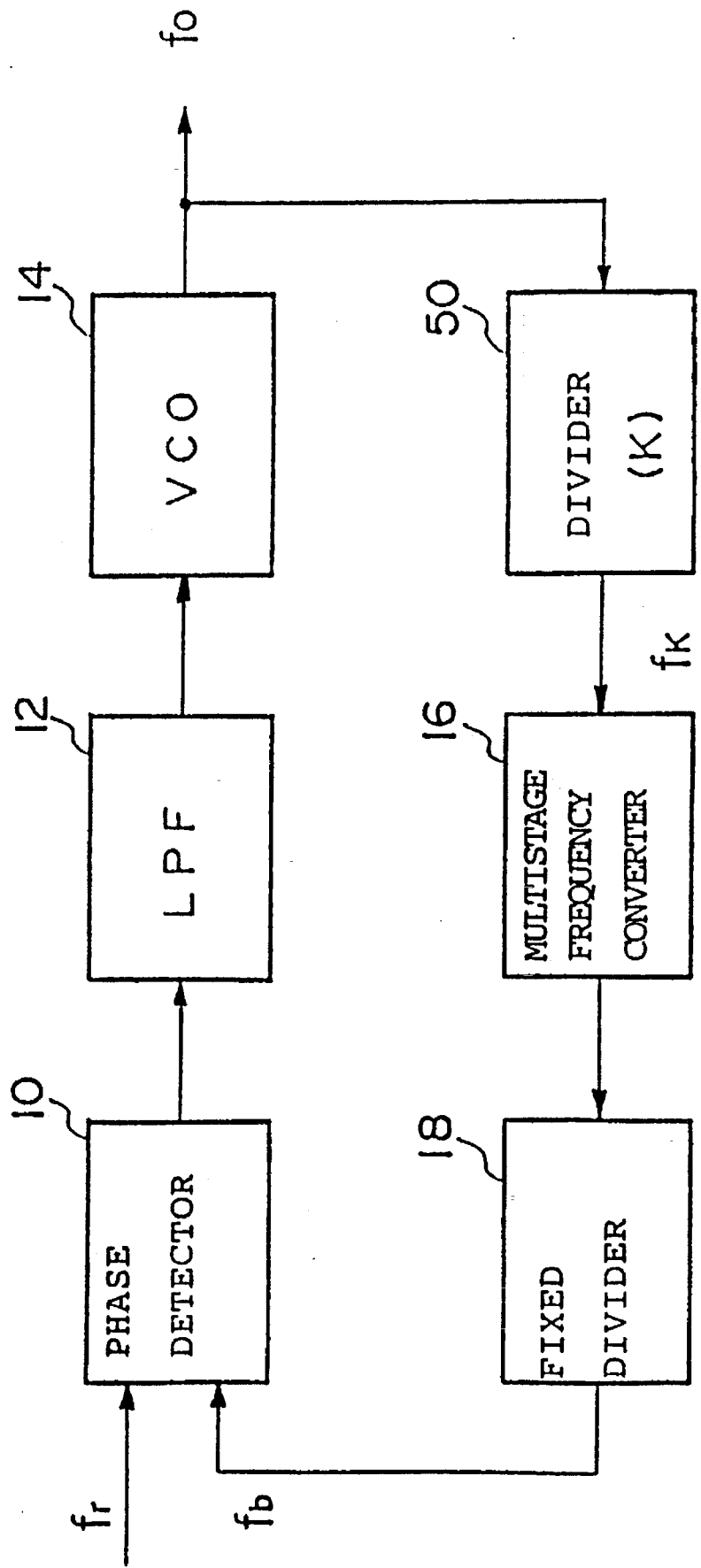
FIG. 35 is a view showing the arrangement of the second embodiment of a frequency synthesizer constructed in accordance with the present invention.

FIG. 35 is a block diagram showing the basic arrangement of the second embodiment of a frequency synthesizer constructed in accordance with the present invention. The frequency synthesizer comprises a divider 50 having a division ratio K, in addition to the components of the frequency synthesizer shown in FIG. 1. The divider 50 is connected to-the leading stage of the multistage frequency converter 16 and adapted to divide the output frequency fo of the voltage controlled oscillator 14 with the division ratio K to form an output frequency fk which in turn is inputted into the multistage frequency converter 16.

As the output frequency fo is increased in the frequency synthesizers shown in FIGS. 1 and 8, the power consumption can be increased. As shown in FIG. 35, however, the power consumption can be prevented from being increased by interposing a fixed or variable divider 50 into the leading stage of the multistage frequency converter 16. More particularly, the higher output frequency fo of the voltage control led oscillator 14 is decreased to a lower frequency fk by the fixed divider 50. A pulse train having such a lower frequency fk can be inputted into the multi-stage frequency converter 16 to reduce the power consumption greatly.

FIG. 36 shows various combinations of division ratios when the multistage frequency converter 16 comprises a plurality of frequency converters connected in series to each other. When the division ratio K of the divider 50 located in the leading stage of the multistage frequency converter 16 is equal to 10 and the reference frequency fr is equal to 1 MHz, the output frequency fo is changed at every 25 kHz frequency interval between 1.400 GHz and 1.425 GHz. When the multistage frequency converter 16 of FIG. 35 comprises the frequency converters connected in series to each other as shown in FIG. 6, the error of the output frequency fo can be maintained within ±137 Hz.

FIG. 37 shows various combinations of division ratio when the multistage frequency converter 16 of FIG. 35 is constructed as shown in FIG. 34. When the division ratio K of the divider 50 located in the leading stage of the multistage frequency converter 16 is equal to 8 and the reference frequency fr is equal to 1 MHz, the output frequency fo is changed at every 25 kHz frequency interval between 1.400 GHz and 1.425 GHz. As shown in FIG. 37, the error of the output frequency fo can be maintained within ±23 Hz.

Unlike the case of FIG. 33, the reference frequency fr in the examples shown in FIGS. 36 and 37 is set to be equal to 1 MHz. This is because if the reference frequency fr is set to be equal to 2.5 MHz in the arrangement of FIG. 35, the output frequency fo may have a substantial interval error. By increasing the number of stages in the multistage frequency converter 16 to four or more, however, the interval error in the output frequency fo can be reduced even if the reference frequency fr is set to be equal to 2.5 MHz.

When the frequency synthesizer shown in FIG. 1, 8 or 35 is used, the reference and feedback frequencies fr, fb can be set much higher than that of the prior art frequency synthesizer (e.g. 100 times). At the same time, very fast acquisition time can be provided since the time constant in the low-pass filter can be decreased. Even if a bias voltage applied to the voltage controlled oscillator 14 includes an error, the acquisition time can be faster that of the prior art frequency synthesizer. Particularly, when the bias voltage is applied to the frequency synthesizer at a level equal to 100% of the normal, the acquisition time can be extremely shortened to about one-tenth of a cycle of the step frequency (the smallest frequency interval Δf).

In order to confirm the characteristics of the frequency synthesizers constructed in accordance with the aforementioned embodiments of the present invention, the acquisition time in the frequency synthesizers of the present invention is compared with that of a prior art frequency synthesizer, using the following parameters:

(1) Common parameters in all the frequency synthesizers
Range of change in the output frequency fo: 4.1 MHz–4.2 MHz
The output frequency interval Δf: 100 Hz
Changes of the output frequency: 407 steps (407 frequency intervals)
4.1001 MHz–4.1408 MHz (40.7 kHz)

(2) Parameters in the frequency synthesizer of the present invention shown in FIG. 8
Input frequency f3 of the fixed divider 18: 4.0 MHz
Reference frequency fr: 10 kHz
Division ratio N of the fixed divider 18:400

Figure 38:
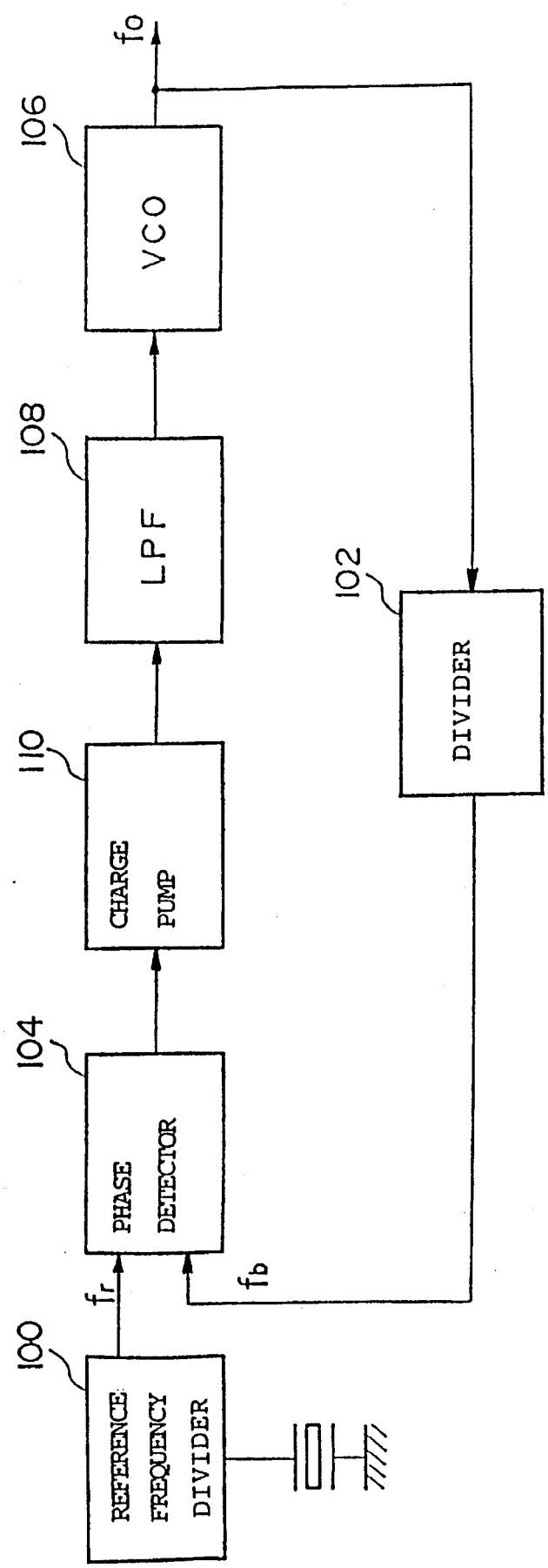
FIG. 38 is a block diagram of the basic arrangement of a prior art frequency synthesizer.

(3) Parameters in the frequency synthesizer of the prior art shown in FIG. 38
Reference frequency fr: 100 Hz
Division ratio N of the divider 102:41000–42000

Although both the frequency synthesizers of the invention and prior art have the same changes of the output frequency, the frequency synthesizer of the present embodiment can use the multistage frequency converter 16 to increase the reference frequency fr and also to reduce the division ratio.

Figure 9:
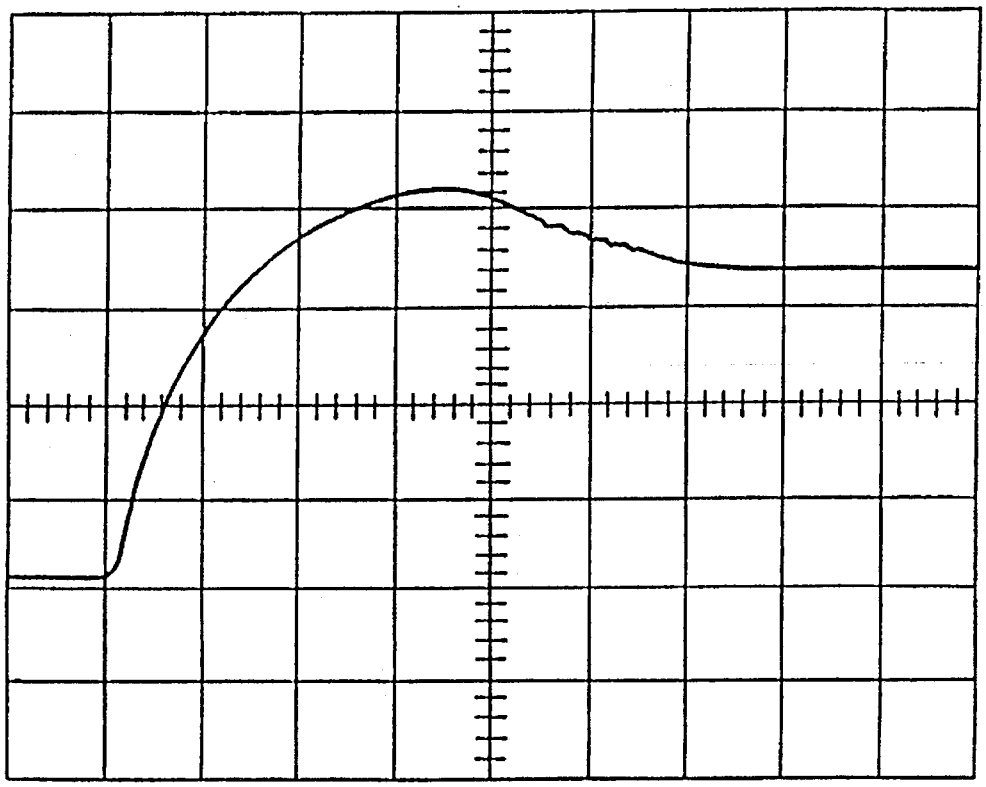
FIG. 9 is a graph illustrating the acquisition time in a prior art frequency synthesizer when no bias voltage will be applied to the voltage control led oscillator and the divider will not be reset.
Figure 10:
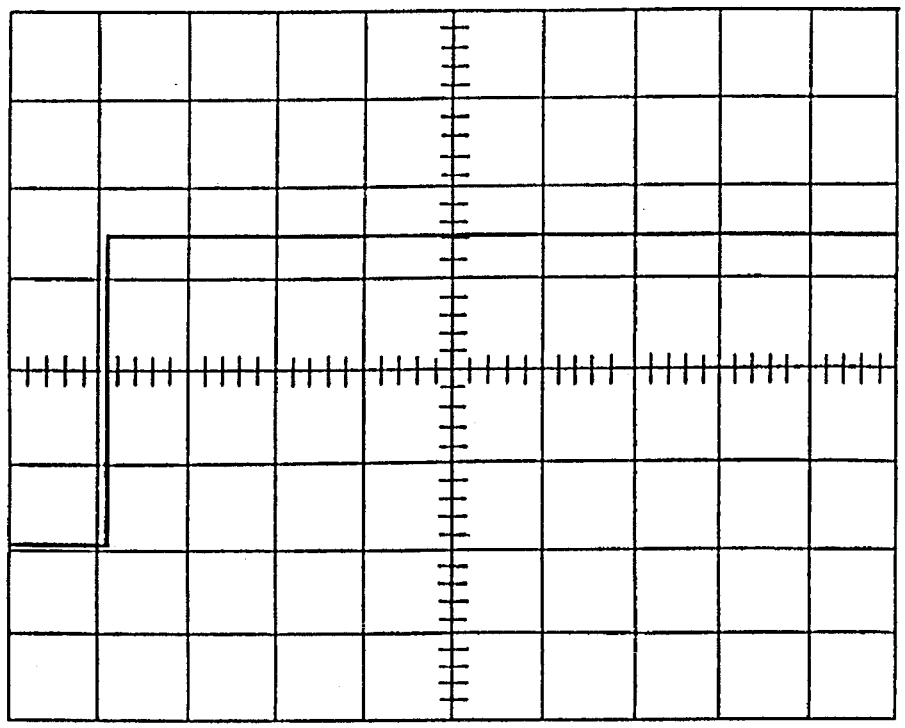
FIG. 10 is a graph illustrating the acquisition the in the frequency synthesizer constructed according to the first embodiment of the present invent ton when no bias voltage will be applied to the voltage controlled oscillator and the divider will not be reset.

FIGS. 9 and 10 show the acquisition times in the frequency synthesizers of the invention and prior art when no bias voltage will be applied to the voltage controlled oscillator 14 and the divider will not be reset. As seen from FIG. 9, the acquisition time in the prior art is equal to 7 sec. while the acquisition time of the present invention is equal to about 0.1 sec. It is understood that the frequency synthesizer of the present embodiment has its substantially improved acquisition time, even though no bias voltage and reset signal will be applied thereto.

Figure 11:
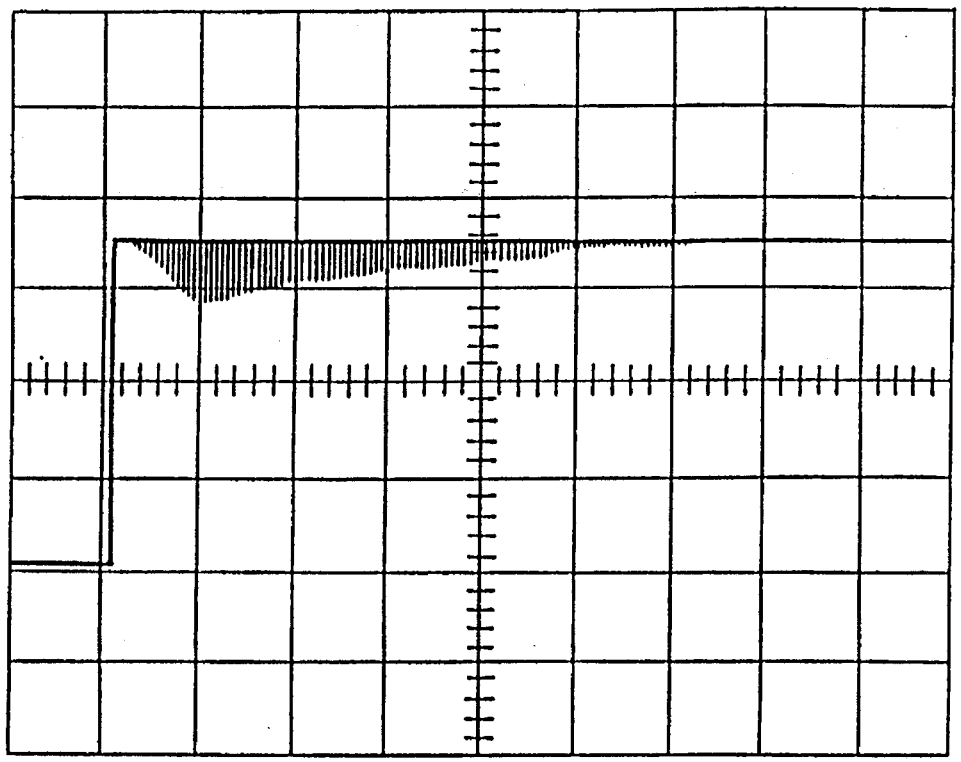
FIG. 11 is a graph illustrating the acquisition time in a prior art frequency synthesizer when a bias voltage will be applied to the voltage controlled oscillator on switching of the output frequency and the reference and fixed frequency dividers will be reset.
Figure 12:
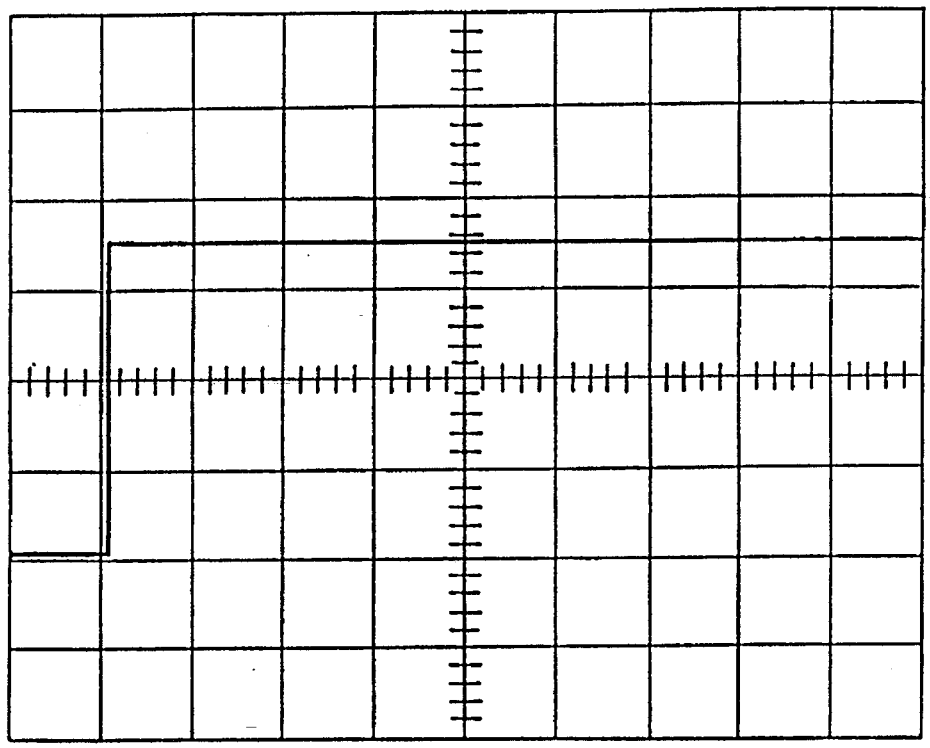
FIGS. 12 and 13 are graphs illustrating the acquisition time in the first embodiment of the frequency synthesizer according to the present invention when a bias voltage will be applied to the voltage controlled oscillator on switching of the output frequency and the reference and fixed frequency dividers will be reset.
Figure 13:
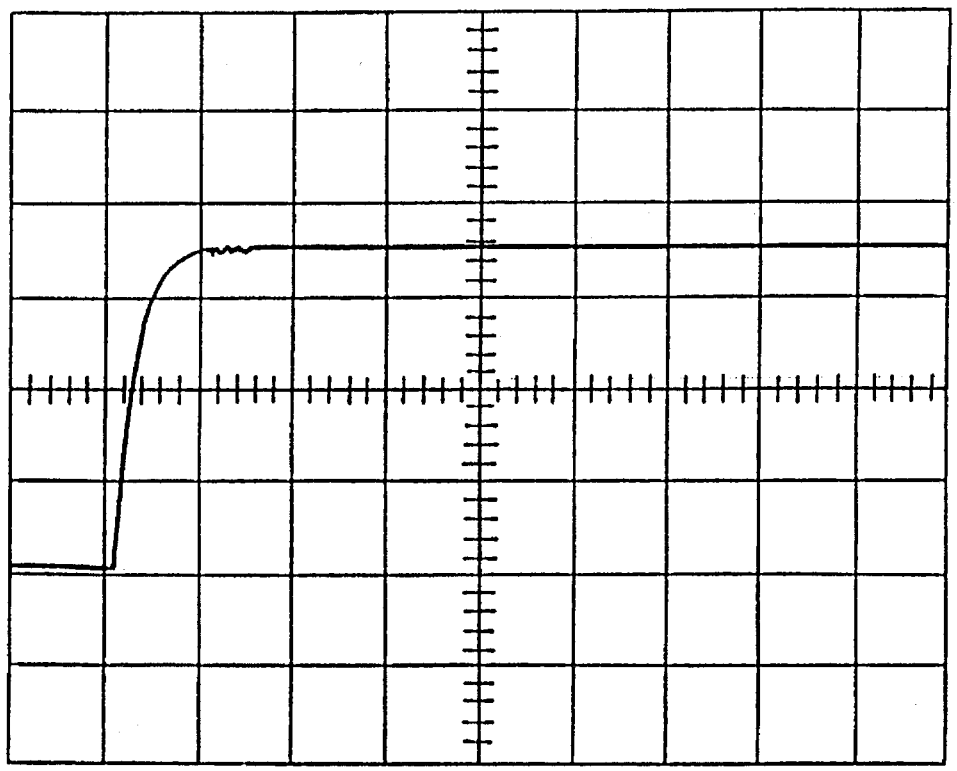

FIGS. 11, 12 and 13 show acquisition times obtained when on switching of the output frequency fo, a bias voltage corresponding to a new output frequency is applied to the voltage controlled oscillator 14 and the reference and fixed dividers are reset and initialized by the controller.

In FIG. 13, the time axis (transverse axis) of FIG. 12 is enlarged.

In such a case, the acquisition time in the prior art system shown in FIG. 11 is equal to about 600 msec while the acquisition time of the present embodiment is highly improved to be equal to about one msec, as seen from FIG. 13.

Therefore, the acquisition time in the frequency synthesizer of the present embodiment becomes about one-tenth of a cycle of the reference frequency (frequency interval) in the prior art frequency synthesizer.

If it is assumed that the output frequency is ranged between 1.400 GHz and 1.425 GHz, the frequency interval being equal to 25 kHz and the reference Frequency being equal to 2.5 MHz, the acquisition time of the present embodiment becomes equal to four μ sec.

When the reference frequency fr is increased to 25 MHz, the acquisition time must be equal to about 0.4 μ sec. However, the phase jitter in the output of the divider 18 will be substantially increased since the division ratio N therein is smaller. Thus, this unsuitably increases the spurious components in the frequency synthesizer.

However, if the reference frequency fr is set to be 25 MHz immediately after switching of the frequency and then changed to 2.5 MHz, the acquisition time can be reduced to a level smaller than four μ sec. and further to a level equal to or smaller than one μ sec.

The voltage controlled oscillator 14 must be considered with respect to its frequency drift affecting to the acquisition time since the frequency drift depends on change in the temperature.

Figure 14:
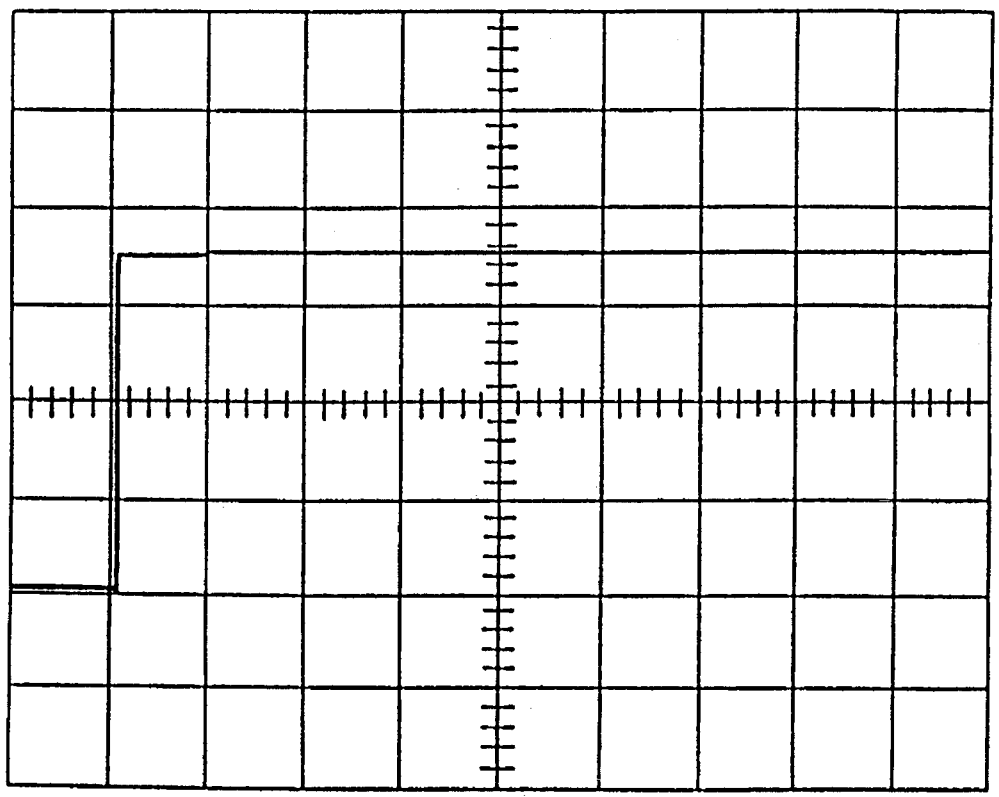
FIG. 14 is a graph illustrating the acquisition time in a prior art frequency synthesizer when a bias voltage equal to 95% of the normal bias voltage is inputted thereinto to grasp changes in the acquisition characteristic due to the frequency drift of the voltage controlled oscillator.
Figure 15:
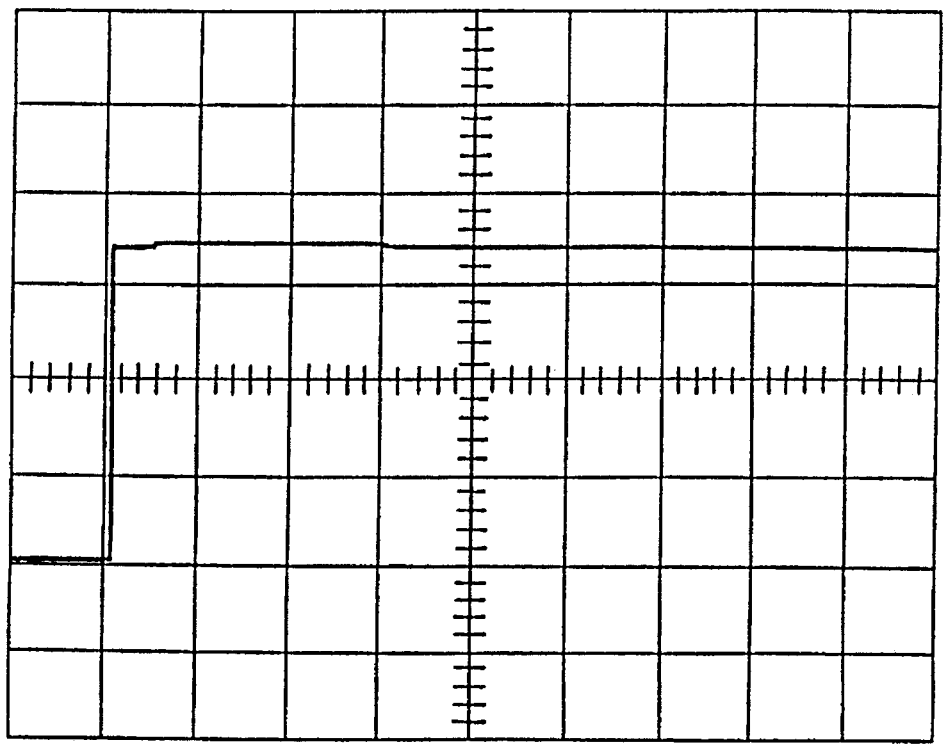
FIG. 15 is a graph illustrating the acquisition time in the first embodiment of the frequency synthesizer according to the present invention when a bias voltage equal to 95% of the normal bias voltage is inputted thereinto to grasp changes in the acquisition characteristic due to the frequency drift of the voltage control led oscillator.

FIGS. 14 and 15 illustrate the acquisition times of the frequency synthesizers when a bias voltage equal to 95% of the normal bias voltage is inputted thereinto to grasp changes in the acquisition characteristic due to the frequency drift of the voltage controlled oscillator 14. As will be apparent from these figures, even if 5% drift is produced, the acquisition time of the frequency synthesizer according to the present embodiment can be within about four cycles of the step frequency (the channel frequency interval Δf).

Figure 16:
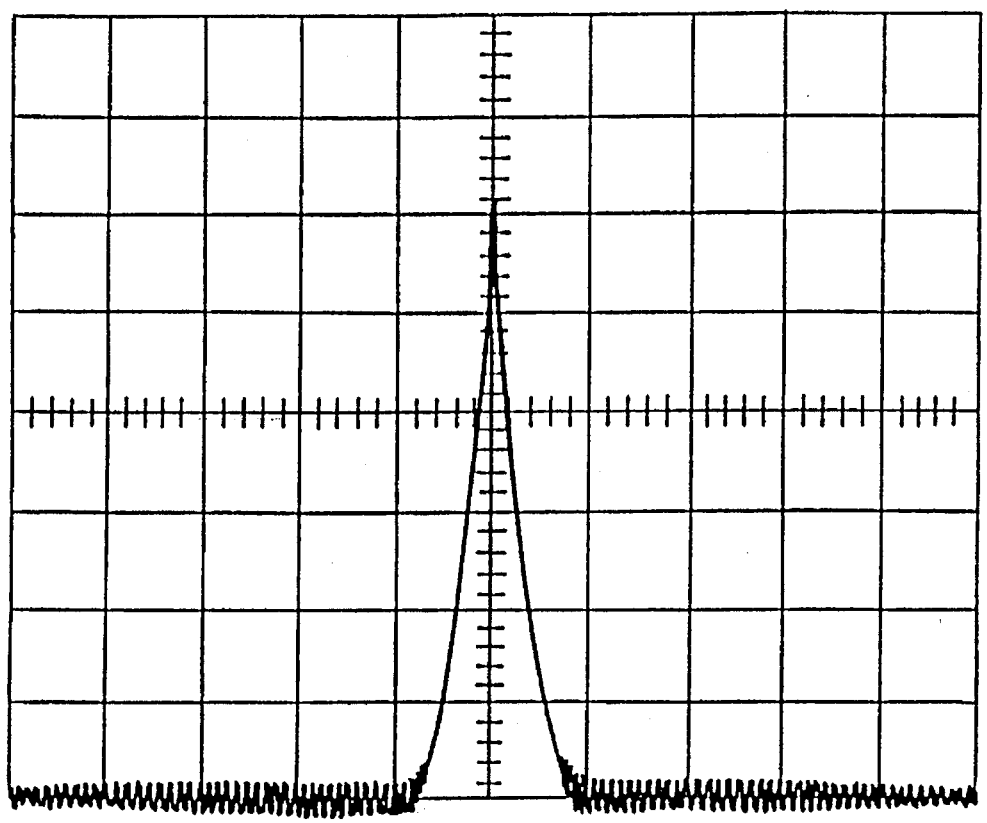
FIG. 16 is a graph illustrating output spectra in the first embodiment of the frequency synthesizer according to the present invention.

FIG. 16 shows the fact that the output spectrum of the frequency synthesizer according to the present embodiment has reduced the number of spurious components.

Although some preferred embodiments of the present invention have been described, it is of course understood that the present invention is not limited to these embodiments. For example, the multistage frequency converter 16, which comprises a plurality of frequency converters connected in series to each other as shown in FIG. 6 or parallel to each other as shown in FIG. 34, may be composed of a combination of series and parallel connections.

Although the embodiments of the present invention have been described as to the frequency synthesizer which comprises the frequency converters shown in FIG. 2 or the multistage frequency converter as shown in FIG. 6 or 84, the frequency synthesizer may be replaced by any other circuit including a plurality of frequency converters or a multistage frequency converter.

ADVANTAGES OF THE INVENTION

As will be apparent from the foregoing, the present invention can have an increased reference frequency to provide a greatly shortened acquisition time by utilizing a frequency synthesizer comprising a plurality of frequency converters or a multistage frequency converter. This also enables the non-integer division ratio to be finely set.

We claim:

1. A frequency converter comprising:

a divider, a count value of the divider being decremented by one for each pulse of a pulse train having a predetermined frequency for performing a dividing operation, the count value being decremented from an initial integer division ratio, wherein the count value is reset to the initial integer division ratio and the divider generates an output signal when the count value is zero;

a nonvolatile memory device coupled to the divider and storing a plurality of integer division ratios, one of the plurality of integer division ratios being output from the nonvolatile memory device to the divider as the initial integer division ratio in response to an initial integer division ratio selecting signal; and a cycle swallower for receiving the output signal from the divider as a control input signal to remove pulses from the pulse train at a predetermined interval corresponding to the initial integer division ratio, thereby providing a frequency converter output signal having a frequency that is a non-integer times lower than the frequency of the pulse train.

2. A frequency converter as defined in claim 1 wherein said non-integer is (1-1/M) where M is the initial integer division ratio of said divider.

3. A multistage frequency converter comprising a plurality of serially connected frequency converters, each of said frequency converters comprising:

a divider, a count value of the divider being decremented by one for each pulse of an input pulse train, the count value being decremented from an initial integer division ratio, wherein the count value is reset to the initial integer division ratio and the divider generates an output signal when the count value is zero;

a nonvolatile memory device coupled to the divider and storing a plurality of integer division ratios, one of the plurality of integer division ratios being output from the nonvolatile memory device to the divider as the initial integer division ratio in response to an initial integer division ratio selection signal; and a cycle swallower for receiving the output signal from the divider as a control input signal to remove pulses from the input pulse train at a predetermined interval corresponding to the initial integer division ratio and outputting an output pulse train, wherein at least one of the frequency converters receives the output pulse train from another of the frequency converters as the input pulse train.

4. A multistage frequency converter, comprising a plurality of frequency converters, each of said frequency converters comprising:

a divider, a count value of the divider being decremented by one for each pulse of a pulse train, the count value being decremented from an initial integer division ratio, wherein the count value is reset to the initial integer division ratio and the divider generates an output signal when the count value is zero;

a nonvolatile memory device coupled to the divider and storing a plurality of integer division ratios, one of the plurality of integer division ratios being output from the nonvolatile memory device to the divider as the initial integer division ratio in response to an initial integer division ratio selection signal; and a cycle swallower for receiving the output signal from the divider as a control input signal to remove pulses from a common pulse train at a predetermined interval corresponding to the initial integer division ratio and outputting an output pulse train, wherein the divider of one of the frequency converters receives the output pulse train from the cycle swallower in another of the frequency converters as an input pulse train.

5. A frequency synthesizer comprising:

a phase detector comparing a reference frequency with a feedback frequency;

a filter connected to the phase detector and passing a low frequency;

a voltage controlled oscillator connected to the filter and generating a pulse train;

a frequency converter inputting the pulse train from the voltage controlled oscillator, the frequency converter comprising:

a first divider, a count value of the first divider decremented by one for each pulse of the pulse train having a predetermined frequency for performing a dividing operation, the count value being decremented from an initial integer division ratio, wherein the count value is reset to the initial integer division ratio and the first divider generates an output signal when the count is zero, a nonvolatile memory device coupled to the first divider and storing a plurality of the integer division ratios, one of the plurality of integer division ratios being output from the nonvolatile memory device to the first divider as the initial integer division ratio, a cycle swallower inputting the output signal of the first divider as a control input signal to remove pulses from the pulse train at a predetermined interval corresponding to the initial integer division ratio, and a second divider dividing an output signal of the frequency converter to form a feedback frequency, wherein the reference and feedback frequencies are controlled to be equal to each other.

6. A frequency synthesizer as defined in claim 5 wherein said second divider is a fixed divider having a fixed division ratio.

7. A frequency synthesizer as defined in claim 5 wherein said second divider is a variable divider having a variable division ratio.

8. A frequency synthesizer comprising:

a phase detector comparing a reference frequency with a feedback frequency;

a filter connected to the phase detector and passing a low frequency;

a voltage controlled oscillator connected to the filter and generating a pulse train;

a multistage frequency converter inputting the pulse train from the voltage controlled oscillator as an input pulse train; and a first divider dividing the output signal from the multistage frequency converter to form the feedback frequency, wherein the reference and feedback frequencies are controlled to be equal to each other, and said multistage frequency converter includes a plurality of serially connected frequency converters, each of said frequency converters comprising:

a second divider, a count value of the second divider decremented by one for each pulse of an input signal, the count value being decremented from an initial integer division ratio, the count value being reset to the initial integer division ratio and the second divider generates an output signal when the count value is zero, a nonvolatile memory device coupled to the second divider and storing a plurality of the integer division ratios, one of the plurality of integer division ratios being output from the nonvolatile memory device to the second divider as the initial integer division ratio, and a cycle swallower inputting the output signal from the second divider as a control input signal to remove pulses from the input pulse train at a predetermined interval corresponding to the initial integer division ratio and outputting an output pulse train, one of the frequency converters receiving the output pulse train from another of the frequency converters as the input pulse train.

9. A frequency synthesizer as defined in claim 8 wherein said first divider is a fixed divider having a fixed division ratio.

10. A frequency synthesizer as defined in claim 8 wherein said first divider is a variable divider having a variable division ratio.

11. A frequency synthesizer having a plurality of frequency converters, each of said frequency converters comprising:

a divider, a count value of the divider decremented by one for each pulse of an input pulse train, the count value being decremented from an initial integer division ratio, wherein the count value is reset to the initial integer division ratio and the divider generates an output signal when the count value is zero;

a nonvolatile memory device coupled to the divider and storing a plurality of the integer division ratios, one of the plurality of integer division ratios being output from the nonvolatile memory device to the divider as the initial integer division ratio; and a cycle swallower inputting the output signal from the divider as a control input signal to remove pulses from the pulse train at a predetermined interval corresponding to the initial integer division ratio and outputting an output pulse train, wherein the divider in one of the frequency converters receive the output pulse train from the cycle swallower in another of the frequency converters as the input pulse train.

12. A frequency synthesizer as defined in claim 11, wherein said divider is a fixed divider having a fixed division ratio.

13. A frequency synthesizer as defined in claim 11, wherein said divider is a variable divider having a variable division ratio.

14. A frequency synthesizer comprising:

a phase detector comparing a reference frequency with a feedback frequency;

a filter connected to the phase detector and passing a low frequency;

a voltage controlled oscillator connected to the filter and generating a pulse train;

a first divider dividing the pulse train from said voltage controlled oscillator and outputting a first divider output signal;

a frequency converter comprising;

a second divider, a count value of the second divider decremented by one for each pulse of the first divider output signal, which has a predetermined frequency for performing a dividing operation, the count value being decremented from an initial integer division ratio, wherein the count value is reset to the initial integer division ratio and the second divider generates a second divider output signal when the count value is zero, a nonvolatile memory device coupled to the second divider and storing a plurality of the integer division ratios, one of the plurality of integer division ratios output from the nonvolatile memory device to the second divider is the initial integer division ratio, and a cycle swallower inputting the second divider signal output from the second divider as a control input signal to remove pulses from the first divider output signal at a predetermined interval corresponding to the initial integer division ratio; and a third divider dividing an output of said frequency converter to form said feedback frequency, said reference and feedback frequencies being controlled to be equal to each other.

15. A frequency synthesizer as defined in claim 14 wherein said third divider is a fixed divider having a fixed division ratio.

16. A frequency synthesizer as defined in claim 14 wherein said third divider is a variable divider having a variable division ratio.

17. A frequency synthesizer comprising:

a phase detector comparing a reference frequency with a feedback frequency;

a filter connected to the phase detector and passing a low frequency;

a voltage controlled oscillator connected to the filter and outputting an oscillating signal;

a first divider for dividing the oscillation signal from said voltage controlled oscillator;

a multistage frequency converter inputting a pulse train from said first divider as an input pulse train; and a second divider dividing an output of said multistage frequency converter to form said feedback frequency, said reference and feedback frequencies being controlled to be equal to each other, wherein said multistage frequency converter includes a plurality of serially connected frequency converters, each of said frequency converters comprising:

a third divider, a count value of the third divider decremented by one for each pulse of the input pulse train, the count vale being decremented from an initial integer division ratio, wherein the count value is reset to the initial integer division ratio and the third divider generates an output signal when the count value is zero, a nonvolatile memory device coupled to the third divider and storing a plurality of the integer division ratios, one of the plurality of integer division ratios output from the nonvolatile memory device to the third divider as the initial integer division ratio, and a cycle swallower for receiving the output signal from the third divider as a control input signal to remove pulses from the input pulse train at a predetermined interval corresponding to the initial integer division ratio and outputting an output pulse train, one of the frequency converters. receiving the output pulse train from another of the frequency converter as the input pulse train.

18. A frequency synthesizer as defined in claim 17 wherein said second divider is a fixed divider having a fixed division ratio.

19. A frequency synthesizer as defined in claim 17 wherein said second divider is a variable divider having a variable division ratio.

20. A frequency synthesizer having a plurality of frequency converters, each of said frequency converters comprising:

a divider, a count value of the divider decremented by one for each pulse of an input pulse train, the count value being decremented from an initial integer division ratio, wherein the count value is reset to the initial integer division ratio and the divider generates an output signal when the count value is zero;

a nonvolatile memory device coupled to the divider and storing a plurality of the integer division ratios, one of the plurality of integer division ratios output from the nonvolatile memory device to the divider as the initial integer division ratio; and a cycle swallower inputting the output signal of the divider as a control input signal to remove pulses from the input pulse train at a predetermined interval corresponding to the initial integer division ratio and outputting an outputting pulse train, wherein the divider of at least one of the frequency converters receives the output pulse train from the cycle swallower in another of the frequency converters as the input pulse train.

21. A frequency synthesizer as defined in claim 20, wherein said divider is a fixed divider having a fixed division ratio.

22. A frequency synthesizer as defined in claim 20, wherein said divider is a variable divider having a variable division ratio.

* * * * *